United States Patent
Min et al.

(10) Patent No.: US 11,142,693 B2
(45) Date of Patent: Oct. 12, 2021

(54) NANOPLATELET

(71) Applicant: SAMSUNG ELECTRONICS CO., LTD., Suwon-si (KR)

(72) Inventors: Jihyun Min, Seoul (KR); Eun Joo Jang, Suwon-si (KR); Yong Wook Kim, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/850,119

(22) Filed: Apr. 16, 2020

(65) Prior Publication Data
US 2020/0332188 A1    Oct. 22, 2020

(30) Foreign Application Priority Data
Apr. 17, 2019    (KR) ................... 10-2019-0045055

(51) Int. Cl.
| | |
|---|---|
| *C09K 11/00* | (2006.01) |
| *H01B 1/00* | (2006.01) |
| *H01L 27/00* | (2006.01) |
| *C09K 11/88* | (2006.01) |
| *C09K 11/02* | (2006.01) |

(Continued)

(52) U.S. Cl.
CPC ............ *C09K 11/883* (2013.01); *C09K 11/02* (2013.01); *C09K 11/0883* (2013.01); *H01B 1/06* (2013.01); *H01L 27/322* (2013.01); *H01L 27/3244* (2013.01); *B82Y 20/00* (2013.01); *B82Y 40/00* (2013.01); *G02F 1/133514* (2013.01); *G02F 1/133617* (2013.01); *G02F 2202/36* (2013.01)

(58) Field of Classification Search
CPC ... H01B 1/00; H01B 1/06; H01B 1/08; H01B 1/10; H01B 1/20; C09K 11/02; C09K 11/0883; C09K 11/56; C09K 11/562; H01L 27/3244
See application file for complete search history.

(56) References Cited

U.S. PATENT DOCUMENTS

| | | | |
|---|---|---|---|
| 9,287,484 B2* | 3/2016 | Roh ..................... C01B 19/007 |
| 9,711,414 B2* | 7/2017 | Hatcher .................. H01L 29/22 |

(Continued)

FOREIGN PATENT DOCUMENTS

| | | | |
|---|---|---|---|
| CN | 106479481 A | | 3/2017 |
| CN | 108404933 A | * | 8/2018 |

(Continued)

OTHER PUBLICATIONS

Liu et al "Synthesis of porous ZnS/ZnSe nanosheets for enhanced visible light photocatalytic activity", Journal of Materials Science: Materials in Electronics (2018) 29:11605-11612.*

(Continued)

*Primary Examiner* — Mark Kopec
(74) *Attorney, Agent, or Firm* — Cantor Colburn LLP

(57) ABSTRACT

A nanoplatelet including a two-dimensional template including a first semiconductor nanocrystal; and a first shell including a second semiconductor nanocrystal disposed on a surface of the two-dimensional template, the second semiconductor nanocrystal having a composition different from the first semiconductor nanocrystal, wherein the second semiconductor nanocrystal includes a Group III-V compound, and wherein the nanoplatelet does not include cadmium.

24 Claims, 10 Drawing Sheets

(51) Int. Cl.
*C09K 11/08* (2006.01)
*H01L 27/32* (2006.01)
*H01B 1/06* (2006.01)
*B82Y 20/00* (2011.01)
*B82Y 40/00* (2011.01)
*G02F 1/1335* (2006.01)
*G02F 1/13357* (2006.01)

(56) References Cited

U.S. PATENT DOCUMENTS

| | | | |
|---|---|---|---|
| 2007/0151597 A1 | 7/2007 | Chen et al. | |
| 2008/0220593 A1 | 9/2008 | Pickett et al. | |
| 2011/0108799 A1 | 5/2011 | Pickett et al. | |
| 2017/0306227 A1 | 10/2017 | Ippen et al. | |
| 2018/0106813 A1* | 4/2018 | Heuclin | G01N 33/587 |
| 2019/0002759 A1 | 1/2019 | D'Amico et al. | |
| 2019/0040313 A1 | 2/2019 | Pousthomis et al. | |
| 2019/0115212 A1* | 4/2019 | Nadal | C09K 11/02 |
| 2019/0211260 A1* | 7/2019 | Won | C09K 11/565 |

FOREIGN PATENT DOCUMENTS

| | | |
|---|---|---|
| KR | 20130022639 A | 3/2013 |
| KR | 101563878 B1 | 10/2015 |
| KR | 20180005164 A | 1/2018 |
| WO | 2007020416 A1 | 2/2007 |
| WO | 2018220167 A1 | 12/2018 |

OTHER PUBLICATIONS

Wang et al "Piezotronic effect enhanced photocatalysis in strained anisotropic ZnO/TiO2 nanoplatelets via thermal stress", ACS Nano 2016, 10,2636-2643.*

Bouet et al "Synthesis of zinc and lead chalcogenide core and core/shell nanoplatelets using sequential cation exchange reactions", Chemistry of Materials, 2014, 26, 3002-3008.*

A. M. Saeboe et al., "Pushing indium phosphide quantum dot emission deeper into the near infrared," Proceedings of SPIE, 2018, pp. 1050715-1~1050715-9, vol. 10507.

A.M. Saeboe et al., "Pushing indium phosphide quantum dot emission deeper into the near infrared," Proceedings of the SPIE, 2018, pp. 1050715-1~1050715-9, vol. 10507.

Extended European Search Report dated Oct. 16, 2020, of the corresponding European Patent Application No. 20169817.2.

Cadimium selenide, Wikipedia, pp. 1-7, https://en.wikipedia.org/wiki/Cadmium_selenide, Apr. 6, 2021.

Sabit Floroz, "Structural, optical and photovoltaic properties of Co (3%): CdZnS nanoparticles," Indian Journal of Pure & Applied Physics, Oct. 2018, pp. 759-764, vol. 56.

* cited by examiner

NANOPLATELET

CROSS-REFERENCE TO RELATED APPLICATION

This application claims priority to and the benefit of Korean Patent Application No. 10-2019-0045055 filed in the Korean Intellectual Property Office on Apr. 17, 2019, and all the benefits accruing therefrom under 35 U.S.C. § 119, the content of which in its entirety is herein incorporated by reference.

BACKGROUND

1. Field

A nanoplatelet is disclosed.

2. Description of the Related Art

Nano-sized semiconductor nanocrystal particles (also referred to as "quantum dots") may have different energy bandgaps by controlling sizes and compositions of nanocrystals, unlike bulk materials. Quantum dots may exhibit electroluminescence and photoluminescence properties. Luminescence properties of semiconductor nanocrystals may be applied, e.g., used, in various fields. From an environmental perspective, development of non-cadmium-based materials capable of realizing, e.g., exhibiting, improved luminescence properties are desirable.

SUMMARY

An embodiment provides a non-cadmium-based nanoplatelet that may exhibit improved luminescence properties (e.g., narrow full width at half maximum (FWHM)).

An embodiment provides a composition including the non-cadmium-based nanoplatelet.

An embodiment provides a semiconductor nanocrystal-polymer composite including the non-cadmium-based nanoplatelet.

An embodiment provides a stacked structure and an electronic device including the semiconductor nanocrystal-polymer composite.

In an embodiment, a nanoplatelet includes a two-dimensional template including a first semiconductor nanocrystal; and a first shell including a second semiconductor nanocrystal disposed on a surface of the two-dimensional template, the second semiconductor nanocrystal having a composition different from the first semiconductor nanocrystal, wherein the second semiconductor nanocrystal includes a Group III-V compound, and wherein the nanoplatelet does not include cadmium.

The first semiconductor nanocrystal may include a Group II-VI compound.

The Group II-VI compound may include ZnA, wherein, A is selenium, tellurium, sulfur, oxygen, or a combination thereof.

The first semiconductor nanocrystal may include ZnSe, ZnS, ZnTe, ZnTeSe, ZnTeS, ZnTeSeS, ZnO, or a combination thereof.

The first shell may be disposed on (e.g., two) opposite surfaces of the two-dimensional template.

The first shell may be disposed directly on the two-dimensional template.

A thickness of the first shell may be greater than or equal to about 0.5 nanometers (nm) and less than or equal to about 2 nm.

The Group III-V compound may include gallium, indium, or phosphorus.

The Group III-V compound may further include a Group II metal.

The Group III-V compound may include InP, InGaP, GaP, InZnP, GaZnP, InGaZnP, or a combination thereof.

An energy bandgap of the second semiconductor nanocrystal material may be less than an energy bandgap of the first semiconductor nanocrystal material.

A transmission electron microscope energy disperse X-ray spectroscopy analysis (TEM-EDX) of a surface of the nanoplatelet extending in a thickness direction (hereinafter, a thickness surface) may exhibit elements present in the first semiconductor nanocrystal and elements present in the second semiconductor nanocrystal.

A transmission electron microscope energy disperse X-ray spectroscopy analysis of a lateral surface of the nanoplatelet may exhibit elements present in the second semiconductor nanocrystal. A TEM-EDX analysis of a lateral surface of the nanoplatelet may not exhibit elements present in the first semiconductor nanocrystal. The lateral surface of the nanoplatelet may extend in a direction substantially perpendicular to the thickness surface of the nanoplatelet.

The nanoplatelet may further include a second shell including a third semiconductor nanocrystal that is disposed on the first shell, and wherein the third semiconductor nanocrystal has a composition different from a composition of the second semiconductor nanocrystal.

The third semiconductor nanocrystal may include a Group II-VI compound.

The third semiconductor nanocrystal may include ZnA, wherein, A is selenium, tellurium, sulfur, oxygen, or a combination thereof.

The third semiconductor nanocrystal may include ZnSe, ZnS, ZnTe, ZnTeSe, ZnTeS, ZnTeSeS, ZnO, or a combination thereof.

An energy bandgap of the third semiconductor nanocrystal material may be greater than an energy bandgap of the second semiconductor nanocrystal material.

A transmission electron microscope energy disperse X-ray spectroscopy analysis of a lateral surface of the nanoplatelet may exhibit only elements present in the third semiconductor nanocrystal.

A TEM-EDX analysis of a lateral surface of the nanoplatelet may not exhibit elements present in the first semiconductor nanocrystal. A TEM-EDX analysis of a lateral surface of the nanoplatelet may not exhibit zinc, selenium, or a combination thereof.

The nanoplatelet may have a lateral dimension (e.g., obtained by multiplying a width and a length) of greater than about 400 square nanometers ($nm^2$).

The nanoplatelet may have a lateral dimension of greater than or equal to about 750 $nm^2$.

The nanoplatelet may have a lateral dimension of greater than or equal to about 1,000 $nm^2$.

A lateral surface of the nanoplatelet may have at least two pairs of opposite sides.

A lateral surface of the nanoplatelet may have an aspect ratio (e.g., a ratio between a minor axis length and a major axis length) of greater than or equal to about 1:1.1 and less than or equal to about 1:8.

A thickness of the nanoplatelet may be greater than or equal to about 0.5 nm, for example, greater than or equal to about 1 nm, or greater than or equal to about 1.5 nm and less than or equal to about 20 nm, for example, less than or equal to about 15 nm, or less than or equal to about 10 nm.

The nanoplatelet may exhibit two or more absorption peaks in a range of less than or equal to about 500 nm.

A difference between a first absorption peak of the two-dimensional template and a first absorption peak of the nanoplatelet may be less than about 100 nm.

A difference between a first absorption peak of the two-dimensional template and a first absorption peak of the nanoplatelet may be less than about 50 nm.

The first semiconductor nanocrystal may include ZnA (wherein, A is selenium, tellurium, sulfur, oxygen, or a combination thereof), the second semiconductor nanocrystal may include a Group III metal and phosphorus, and in the nanoplatelet, a content of Group III metal may be greater than or equal to about 0.05 moles and less than or equal to about 2 moles, a content of zinc may be greater than or equal to about 1 mole and less than or equal to about 10 moles, and a content of phosphorus may be greater than or equal to about 0.05 moles and less than or equal to about 5 moles, based on 1 mole of the element A.

In an embodiment, a method of producing the aforementioned nanoplatelet includes reacting a first metal precursor of the first semiconductor nanocrystal and a first non-metal precursor of the first semiconductor nanocrystal in an organic solvent in the presence of an organic ligand at a temperature of less than about 175° C. to synthesize a two-dimensional template; and reacting a second metal precursor of the second semiconductor nanocrystal and a second non-metal precursor of the second semiconductor nanocrystal in an organic solvent in the presence of an organic ligand and the two-dimensional template at a temperature of less than or equal to about 200° C. to form a first shell including the second semiconductor nanocrystal on a surface of the two-dimensional template and produce the nanoplatelet.

The method may further include reacting a third metal precursor and a third non-metal precursor for a third semiconductor nanocrystal in an organic solvent in the presence of an organic ligand and the particle on which the first shell is formed (e.g., the particle comprising the first shell formed on the surface of the two-dimensional template) to form a second shell on the first shell.

In an embodiment, a composition includes (e.g., a plurality of) semiconductor nanocrystal particle(s);

a dispersing agent (e.g., a binder monomer or polymer including a carboxylic acid group);

a polymerizable (e.g., photopolymerizable) monomer including a carbon-carbon double bond;

an initiator; and a solvent, wherein the plurality of semiconductor nanocrystal particles includes the aforementioned nanoplatelet.

The composition may further include a poly thiol compound having at least two thiol groups (e.g., at the terminal end), a metal oxide particulate, or a combination thereof.

In an embodiment, a semiconductor nanocrystal-polymer composite includes a polymer matrix; and a plurality of semiconductor nanocrystal particles dispersed in the polymer matrix, wherein the plurality of semiconductor nanocrystal particles includes the aforementioned nanoplatelet.

The polymer matrix may include a cross-linked polymer, a binder polymer having a carboxylic acid group, or a combination thereof.

The cross-linked polymer may include a polymerization product of a (photo)polymerizable monomer including a carbon-carbon double bond, a polymerization product of the (photo)polymerizable monomer and a poly thiol compound having at least two thiol groups at the terminal end, or a combination thereof.

The semiconductor nanocrystal-polymer composite may further include a metal oxide particulate in the polymer matrix.

In an embodiment, a display device includes light emitting element (e.g., photoluminescent element), wherein the light emitting element includes the aforementioned semiconductor nanocrystal-polymer composite. The display device may further include a light source and the light source is configured to supply the light emitting element with incident light.

The incident light may have an emission peak wavelength within a range of about 440 nm to about 470 nm (or 460 nm).

The light emitting element may include a sheet of the semiconductor nanocrystal polymer composite.

The display device may further include a liquid crystal panel, and the sheet of the semiconductor nanocrystal polymer composite may be disposed between the light source and the liquid crystal panel.

The light emitting element may have a stacked structure including a substrate and an emission layer (e.g., light emission layer) disposed on the substrate, wherein the emission layer includes a pattern of the semiconductor nanocrystal polymer composite and the pattern may include a, e.g., at least one, repeating section that emits light of a predetermined wavelength.

The display device may be configured to have a color reproducibility of the BT2020 reference of greater than or equal to about 80%.

The pattern may include a first section configured to emit first light and a second section configured to emit second light having a central wavelength different from the first light.

The light source may include a plurality of light emitting units corresponding respectively to the first section and the second section, wherein the light emitting unit may include a first electrode and a second electrode facing each other and an electroluminescence layer disposed between the first and second electrodes.

The display device may further include a lower substrate, a polarizer disposed under the lower substrate, and a liquid crystal layer disposed between the stacked structure and the lower substrate, wherein the stacked structure may be disposed such that the emission layer faces the liquid crystal layer.

The display device may further include a polarizer between the liquid crystal layer and the emission layer.

The light source may further include a light emitting diode (LED) and optionally a light guide panel.

An embodiment provides an electronic device including the aforementioned nanoplatelet.

The electronic device may be an electroluminescent device, an organic light emitting diode (OLED), a sensor, an imaging sensor, a solar cell, or a liquid crystal display (LCD) device.

The nanoplatelet according to an embodiment may exhibit light of a wide range of wavelengths with improved optical properties (e.g., full width at half maximum (FWHM) of the peak of an absorption spectrum or light emitting spectrum) by controlling the thickness of the first shell. The nanoplatelet may be applied to, e.g., used in, various display devices capable of high color reproducibility, biological labeling (e.g., a bio sensor or bio imaging, etc.), a photodetector, a solar cell, a hybrid composite, and the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
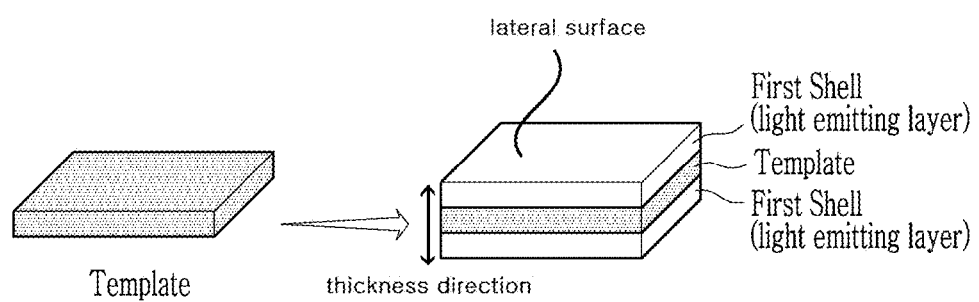
FIG. 1 is a schematic cross-sectional view of a two-dimensional template and a nanoplatelet according to an embodiment.
Figure 2:
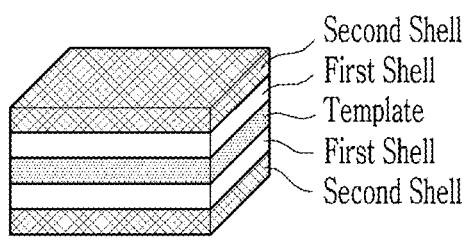
FIG. 2 is a schematic cross-sectional view of a nanoplatelet according to an embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to replacement of hydrogen of a compound or a group by a substituent of a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—O(=NH)NH$_2$), a hydrazino group (—NHNH$_2$), a hydrazono group (=N(NH$_2$)), an aldehyde group (—O(=O)H), a carbamoyl group (—C(O)NH$_2$), a thiol group (—SH), an ester group (—O(=O)OR, wherein R is a C1 to C6 alkyl group or a C6 to C12 aryl group), a carboxyl group (—COOH) or a salt thereof (—O(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

As used herein, when a definition is not otherwise provided, "alkylene group" refers to a straight or branched saturated aliphatic hydrocarbon group having a valence of at least 2 and optionally substituted with a, e.g., at least one, substituent.

As used herein, "arylene group" refers to a functional group having a valence of at least 2 obtained by removal of at least two hydrogens in a, e.g., at least one, aromatic ring, and optionally substituted with a, e.g., at least one, substituent.

In addition, "aliphatic hydrocarbon group" refers to a C1 to C30 linear or branch alkyl group, "aromatic hydrocarbon group" refers to a C6 to C30 aryl group or C2 to C30 heteroaryl group, and "alicyclic hydrocarbon group" refers to a C3 to C30 cycloalkyl group, a C3 to C30 cycloalkenyl group, and a C3 to C30 cycloalkynyl group.

As used herein, "(meth)acrylate" refers to acrylate, methacrylate, or a combination thereof. The (meth)acrylate may include (C1 to C10 alkyl) acrylate, (C1 to C10 alkyl) methacrylate, or a combination thereof.

In an embodiment, a "hydrophobic moiety" may include a group providing the corresponding compound with a tendency to be agglomerated in an aqueous solution and to repel water. For example, the hydrophobic moiety may include an aliphatic hydrocarbon group having a carbon number of 1 or greater (e.g., 2 or greater, 3 or greater, 4 or greater, or 5 or greater) (alkyl, alkenyl, alkynyl, etc.), an aromatic hydrocarbon group having a carbon number of 6 or greater (phenyl, naphthyl, aralkyl group, etc.), or an alicyclic hydrocarbon group having a carbon number of 5 or greater (cyclohexyl, norbornenyl, norbornanyl, tricyclodecanyl, etc.).

As used herein, "visible light" refers to light having a wavelength of about 390 nm to about 700 nm. As used herein, "ultraviolet" or "UV" refers to light having a wavelength of greater than or equal to about 200 nm and less than about 390 nm.

As used herein, "dispersion" refers to dispersion wherein a dispersed phase is a solid and a continuous phase includes a liquid. For example, "dispersion" refers to a colloidal dispersion wherein the dispersed phase has a dimension of greater than or equal to about 1 nm, for example, greater than or equal to about 2 nm, greater than or equal to about 3 nm, or greater than or equal to about 4 nm and several micrometers (μm) or less, (e.g., about 2 μm or less or about 1 μm or less).

As used herein, "Group" refers to a group of Periodic Table.

As used herein, "Group I" refers to Group IA and Group IB, and examples may include Li, Na, K, Rb, and Cs, but are not limited thereto.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and Tl, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group V" refers to Group VA, and examples may include nitrogen, phosphorus, arsenic, antimony, and bismuth, but are not limited thereto.

As used herein, "Group VI" refers to Group VIA, and examples may include oxygen, sulfur, selenium, and tellurium, but are not limited thereto.

As used herein, "size" may refer to a size of a particle or an average size of particles. As used herein, "lateral dimension" may refer to an area of a lateral surface of a particle or an average area of lateral surfaces of particles. As used herein, "lateral surface" of a particle or a nanoplatelet refers to a two dimensional (e.g., top/basal or major) face of the nanoplatelet and "thickness" refers to a distance (e.g., a vertical length) between the two (base and top) lateral surfaces.

Semiconductor nanocrystal particles are crystalline materials several nanometers in size. Such semiconductor nanocrystals particles may have a large surface area per a unit volume due to very small sizes and may exhibit different characteristics from bulk materials having the same composition due to a quantum confinement effect. A semiconductor nanocrystal particle may absorb light from an excitation source and become excited, and may emit energy corresponding to an energy bandgap of the semiconductor nanocrystal particle.

Semiconductor nanocrystal particles have potential applicability to, e.g., in, various electronic devices due to unique photoluminescence characteristics. A core-shell quantum dot in which a semiconductor nanocrystal shell is formed on a three-dimensional core including a semiconductor nanocrystal has been proposed for improved luminescence properties. On the other hand, a cadmium-based quantum dot may exhibit improved properties. However, cadmium may cause environmental and health issues and is one of the regulated elements. Examples of a cadmium-free semiconductor nanocrystal may be a Group III-V based nanocrystal. The cadmium-free semiconductor nanocrystal may have less desirable luminescence properties (e.g., full width at half maximum (FWHM)) and stability compared with a cadmium-based material.

In addition to core-shell quantum dots, nanocrystal particles may have a variety of shapes such as nanoplatelet, nanorod, and multipod. In the case of a spherical particle, a charge carrier is three dimensionally restricted. However, nanoplatelets (e.g., colloidal nanoplatelets, which may be colloidally prepared) have a vertical thickness of few nanometers and lateral sizes of about 10 to 100 nm, capable of forming a quantum well. The lateral sizes of nanoplatelets may be greater than the exciton Bohr radius, and the quantum confinement in nanoplatelets may be stronger for example only in the vertical direction, which may lead to unique properties such as a one-dimensional exciton confinement. While not wanting to be bound by any theory, it is understood that nanoplatelets may exhibit different luminescence properties from core-shell quantum dots. Nanoplatelets emitting visible light (e.g., light of a wavelength of greater than 450 nm) may be based on a cadmium containing semiconductor nanocrystal. Exemplary cadmium free semiconductor nanocrystal materials may include indium phosphide. An InP-based nanoplatelet may have an extremely thin thickness of less than or equal to about 1 nm and may emit light in visible light wavelength regions. However, a solution synthesis process may not produce an InP nanoplatelet having such a thin thickness. Provided is a non-cadmium semiconductor nanocrystal, e.g., InP, capable of emitting light in visible light wavelength regions and having a nanoplatelet shape.

A nanoplatelet according to an embodiment is based on non-cadmium semiconductor nanocrystals. In an embodiment, a semiconductor nanocrystal nanoplatelet (hereinafter, also referred to as NPL) adopts, e.g., includes, a template, and in addition to this, a Group III-V semiconductor nanocrystal material optionally together with a, e.g., at least one, Group II-VI semiconductor nanocrystal material is coated (e.g., on a surface of the template) to obtain a non-cadmium semiconductor nanocrystal NPL.

In an embodiment, the Group III-V semiconductor nanocrystal-based nanoplatelet includes a two-dimensional template including a first semiconductor nanocrystal; and a first shell including a second semiconductor nanocrystal disposed on a, e.g., at least one, surface of the two-dimensional template, the second semiconductor nanocrystal having a composition different from the first semiconductor nanocrystal, wherein the second semiconductor nanocrystal includes a Group III-V compound. The nanoplatelet does not include cadmium.

Referring to FIG. 1, the nanoplatelet according to an embodiment has a template; and an emission layer formed on a, e.g., at least one, surface (or both surfaces) thereof.

The template is a two-dimensional nanoparticle. As used herein, the nanoplatelet (hereinafter, also referred to as NPL) or the two-dimensional template or nanoparticle refers to a particle in which a spacing between two lateral surfaces facing each other (that is, a thickness or vertical thickness) is a nanoscale (e.g., less than 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, less than or equal to about 20 nm, less than or equal to about 10 nm, or less than or equal to about 5 nm). In the nanoplatelet or the two-dimensional template or nanoparticle, a maximum size (e.g., length (L) or width (W)) constituting, e.g., of, the lateral surfaces may be about 5 times or greater, about 6 times or greater, about 7 times or greater, about 8 times or greater, about 9 times or greater, or about 10 times or greater and about 100 times or less, about 90 times or less, about 80 times or less, about 70 times or less, about 60 times or less, about 50 times or less, about 40 times or less, about 30 times or less, about 20 times or less of, e.g., than, the thickness.

In the two-dimensional template, the first semiconductor nanocrystal may include a Group II-VI compound. The first semiconductor nanocrystal may include ZnA (wherein, A is selenium, tellurium, sulfur, oxygen, or a combination thereof). The first semiconductor nanocrystal may include zinc chalcogenide (e.g., zinc selenide). The first semiconductor nanocrystal may include ZnSe, ZnS, ZnTe, ZnTeSe, ZnTeS, ZnTeSeS, ZnO, or a combination thereof. In an embodiment, the two-dimensional template may include zinc and selenium.

The present inventors have found that when the first semiconductor nanocrystal acting as a template has a predetermined thickness (e.g., when the template has a thickness of a predetermined range), it may not have a substantial impact on an emission wavelength of the final NPL. In an embodiment, the thickness of the template may be greater than or equal to about 0.3 nm, for example, greater than or equal to about 0.4 nm, or greater than or equal to about 0.5 nm. In an embodiment, the thickness of the template may be less than or equal to about 10 nm, for example, less than or equal to about 9 nm, less than or equal to about 8 nm, less than or equal to about 7 nm, less than or equal to about 6 nm, less than or equal to about 5 nm, less than or equal to about 4 nm, less than or equal to about 3 nm, less than or equal to about 2 nm, or less than or equal to about 1 nm.

In the NPL according to an embodiment, the emission layer is included in a stacked structure (for example, as a first shell), and the light emitting center is present in the emission layer (i.e., first shell) formed on the template. The first shell may be disposed on opposite both surfaces of the two-dimensional template, respectively. The first shell may be disposed directly on the two-dimensional template (e.g., opposite major surfaces (i.e., top and basal surfaces) of the template).

The Group III-V compound included in the first shell may include a Group III metal selected from gallium, indium, or a combination thereof; and phosphorus. The Group III-V compound may further include a Group II metal (e.g., zinc). The Group III-V compound may further include InP, InGaP, GaP, InZnP, GaZnP, InGaZnP, or a combination thereof. An energy bandgap of the second semiconductor nanocrystal material may be less than an energy bandgap of the first semiconductor nanocrystal material. In an embodiment, the template may include ZnSe and the first shell may include InP or InZnP. In the NPL of an embodiment, the first shell serves as an emission layer.

Therefore, the emission wavelength may be controlled by adjusting the thickness of the first shell. In an embodiment, the thickness of the first shell may be less than or equal to about 3 nm, for example, less than or equal to about 2 nm, less than or equal to about 1 nm, less than or equal to about 0.5 nm, less than or equal to about 0.4 nm, less than or equal to about 0.3 nm, or less than or equal to about 0.2 nm, and greater than or equal to about 0.1 nm.

In an embodiment, the NPL may emit light in the visible light wavelength region. The first shell may include indium and phosphorus. The thickness of the first shell may be less than or equal to about 2 nm and greater than or equal to about 0.5 nm. In an embodiment, NPL may emit green light and the first shell may include indium and phosphorus. The thickness of the first shell may be less than or equal to about 5 nm, less than or equal to about 4 nm, less than or equal to about 3 nm, less than or equal to about 2 nm, less than or equal to about 1 nm, less than or equal to about 0.9 nm, or less than or equal to about 0.8 nm and greater than or equal to about 0.1 nm, greater than or equal to about 0.2 nm, greater than or equal to about 0.3 nm, greater than or equal to about 0.4 nm, or greater than or equal to about 0.5 nm. In an embodiment, the NPL may emit red light, the first shell may include indium and phosphorus. The thickness of the first shell may be less than or equal to about 5 nm, for example, less than or equal to about 4 nm, less than or equal to about 3 nm, less than or equal to about 2 nm, less than or equal to about 1.9 nm, or less than or equal to about 1.8 nm and greater than or equal to about 0.1 nm, greater than or equal to about 0.3 nm, greater than or equal to about 0.5 nm, greater than or equal to about 1 nm, greater than or equal to about 1.1 nm, or greater than or equal to about 1.2 nm.

A wavelength of the green light may be greater than or equal to about 500 nm, for example, greater than or equal to about 510 nm, or greater than or equal to about 520 nm and less than or equal to about 560 nm, for example, less than or equal to about 550 nm, or less than or equal to about 540 nm. A wavelength of the red light may be greater than or equal to about 600 nm, for example, greater than or equal to about 610 nm, or greater than or equal to about 620 nm and less than or equal to about 650 nm, or less than or equal to about 640 nm.

The nanoplatelet according to an embodiment may further include a second shell including a third semiconductor nanocrystal that is disposed on the first shell, wherein the third semiconductor nanocrystal has a composition different from that of the second semiconductor nanocrystal. The second shell may include one or more layers. When the second shell is a multi-layered shell of two or more layers, adjacent layers may have different compositions. The second shell may have a composition that changes in a thickness direction.

The third semiconductor nanocrystal included in the second shell may include a Group II-VI compound. The third semiconductor nanocrystal may include ZnA (wherein, A is selenium, tellurium, sulfur, oxygen, or a combination thereof). The third semiconductor nanocrystal may include ZnSe, ZnS, ZnTe, ZnTeSe, ZnTeS, ZnSeS, ZnTeSeS, ZnO, or a combination thereof.

An energy bandgap of the third semiconductor nanocrystal material may be the same as or greater than an energy bandgap of the second semiconductor nanocrystal material. The energy bandgap of the third semiconductor nanocrystal material may be the same as or greater than the energy bandgap of the first semiconductor nanocrystal material. In an embodiment, the first semiconductor nanocrystal may include zinc and selenium, and the third semiconductor nanocrystal may include zinc and sulfur.

The thickness of the second shell may be adjusted appropriately. For example the thickness of the second shell may be greater than or equal to about 0.3 nm, for example, greater than or equal to about 0.5 nm, greater than or equal to about 0.6 nm, greater than or equal to about 0.9 nm, or greater than or equal to about 1 nm and less than or equal to about 10 nm, less than or equal to about 9 nm, less than or equal to about 8 nm, less than or equal to about 7 nm, less than or equal to about 6 nm, less than or equal to about 5 nm, less than or equal to about 4 nm, less than or equal to about 3 nm, or less than or equal to about 2 nm.

The nanoplatelet may be based on a non-cadmium semiconductor nanocrystal. The nanoplatelet may not include a heavy metal such as cadmium, mercury, or lead.

The nanoplatelet may have a total thickness of less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, less than or equal to about 10 nm, less than or equal to about 9 nm, less than or equal to about 8 nm, less than or equal to about 7 nm, less than or equal to about 6 nm, less than or equal to about 5 nm, less than or equal to about 4 nm, less than or equal to about 3 nm, less than or equal to about 2.5 nm, or less than or equal to about 2 nm. The total thickness of the nanoplatelet may be greater than or equal to about 0.5 nm, for example, greater than or equal to about 0.7 nm, or greater than or equal to about 1 nm. The nanoplatelet may have a laterally increased size. In an embodiment, the nanoplatelet may have a lateral dimension of greater than about 400 $nm^2$, for example, greater than or equal to about 450 $nm^2$, greater than or equal to about 500 $nm^2$, greater than or equal to about 600 $nm^2$, greater than or equal to about 650 $nm^2$, greater than or equal to about 700 $nm^2$, greater than or equal to about 750 $nm^2$, greater than or equal to about 800 $nm^2$, greater than or equal to about 850 $nm^2$, greater than or equal to about 900 $nm^2$, greater than or equal to about 950 $nm^2$, or greater than or equal to about 1,000 $nm^2$, greater than or equal to about 1100 $nm^2$, greater than or equal to about 1200 $nm^2$, greater than or equal to about 1300 $nm^2$, greater than or equal to about 1400 $nm^2$, or greater than or equal to about 1500 $nm^2$. In an embodiment, the lateral dimension of the nanoplatelet may be less than or equal to about 10,000 $nm^2$, for example, less than or equal to about 9,000 $nm^2$, less than or equal to about 8,000 $nm^2$, less than or equal to about 7,000 $nm^2$, less than or equal to about 6,000 $nm^2$, less than or equal to about 5,000 $nm^2$, less than or equal to about 4,000 $nm^2$, less than or equal to about 3,000 $nm^2$, or less than or equal to about 2,000 $nm^2$.

The lateral surface of the nanoplatelet may have a predetermined two-dimensional shape, but is particularly not limited. The lateral surface may have at least two dimensions (e.g., length and width). The lateral surface of the nanoplatelet may be polygon (triangle, quadrangle, parallelogram, rhombus, pentagon, hexagon, etc.). The lateral surface of the nanoplatelet may not be substantially circle. The lateral surface of the nanoplatelet may have a non-circular shape. The lateral surface of the nanoplatelet may have a pair, e.g., at least one pair, or at least two pairs, of sides opposite one another (e.g., facing to each other). In an embodiment, the lateral surface of the nanoplatelet may have a substantially rectangular shape.

The lateral surface of the nanoplatelet may have a length and a width. The lateral surface of the nanoplatelet may have an aspect ratio (e.g., width:length) of greater than or equal to about 1:1.1, for example, greater than or equal to about 1:2, greater than or equal to about 1:2.5, greater than or equal to about 1:3, greater than or equal to about 1:3.5, or greater than or equal to about 1:4 and less than or equal to about 1:8, for example, less than or equal to about 1:7.5, less than or equal to about 1:7, less than or equal to about 1:6.5, less than or equal to about 1:6, or less than or equal to about 1:5.5. The aspect ratio may refer to a ratio between a length of a minor axis and a length of a major axis (e.g., the width: the length).

The nanoplatelet may have a stacked structure and a transmission electron microscopy energy disperse X-ray spectroscopy (TEM-EDX) analysis of a lateral surface thereof may exhibit only the elements that are present in, e.g., constitute, the semiconductor nanocrystal of an outermost layer of the stacked structure. In an embodiment, in a case in which the second semiconductor nanocrystal forms the outermost layer of the stacked structure, a TEM-EDX analysis of the lateral surface of the nanoplatelet may exhibit, e.g., show or include (only) the elements present in, e.g., constituting, the second semiconductor nanocrystal (for example, when the second semiconductor nanocrystal includes indium phosphide, the TEM-EDX results may show the indium and phosphorous and not show selenium that is included in the template). In an embodiment, in a case in which the third semiconductor nanocrystal forms the outermost layer of the stacked structure, a TEM-EDX analysis of the lateral surface of the nanoplatelet may show, e.g., include, (only) the elements present in, e.g., constituting, the third semiconductor nanocrystal (e.g., when the third semiconductor nanocrystal includes ZnS or ZnSeS, the results may show zinc and sulfur and optionally selenium). In this case, a TEM-EDX analysis of the lateral surface of the nanoplatelet may not show phosphorous and indium that are present in the second semiconductor nanocrystal.

In the TEM-EDX analysis, results for a thickness surface of the nanoplatelet (i.e., a surface extending in a thickness direction and connecting two lateral surfaces, i.e., the basal and top surfaces of the nanoplatelet and optionally being substantially vertical to the two lateral surfaces of the nanoplatelet) may be different from those for the lateral surface of the nanoplatelet. The nanoplatelet may exhibit the elements present in, e.g., constituting, the template (e.g., first semiconductor nanocrystal) and the elements present in, e.g., constituting, the first shell (e.g., second semiconductor nanocrystal), and if present, the elements present in, e.g., constituting, the second shell (e.g., third semiconductor nanocrystal) in the TEM-EDX with respect to the thickness surface.

The nanoplatelet may exhibit two or more main absorption peaks (first absorption peak and second absorption peak) in a range of less than or equal to about 500 nm, for example, less than or equal to about 490 nm, less than or equal to about 480 nm, less than or equal to about 470 nm, less than or equal to about 460 nm, less than or equal to about 450 nm, less than or equal to about 440 nm, less than or equal to about 430 nm, less than or equal to about 420 nm, less than or equal to about 410 nm, less than or equal to about 400 nm, less than or equal to about 390 nm, or less than or equal to about 380 nm. The first absorption peak may be a first main peak in the low energy region and the second absorption peak may be a main peak next to the first main peak, showing a higher energy than the first absorption peak (i.e., appearing at a lower wavelength that the first absorption peak). An intensity of the second absorption peak may be greater than or equal to that of the first absorption peak. A difference between the first absorption peak and the second absorption peak may be less than or equal to about 50 nm, for example, less than or equal to about 45 nm, less than or equal to about 40 nm, less than or equal to about 35 nm, less than or equal to about 30 nm, less than or equal to about 25 nm, or less than or equal to about 20 nm. A difference between the first absorption peak and the second absorption peak may be greater than or equal to about 5 nm, greater than or equal to about 10 nm, greater than or equal to about 15 nm, or greater than or equal to about 20 nm.

In the nanoplatelet of an embodiment, a shift of an absorption peak wavelength caused by the formation of the first shell and optionally the second shell with respect to that of the template may be limited (e.g., not significant). Accordingly, in the nanoplatelet according to an embodiment, a difference between the first absorption peak of the template and the first absorption peak of the nanoplatelet may be less than about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, less than or equal to about 20 nm, or less than or equal to about 10 nm. In an embodiment, the difference between the first absorption peak of the two-dimensional template and the first absorption peak of the nanoplatelet may be less than about 50 nm.

The NPL may exhibit an improved full width at half maximum (FWHM) in an absorption spectrum or a light emission spectrum. A cadmium free core-shell quantum dot emitting green light may have a full width at half maximum (FWHM) of greater than 35 nm. In contrast, the NPL of an embodiment may exhibit a full width at half maximum (FWHM) of less than or equal to about 35 nm, for example, less than or equal to about 34 nm, less than or equal to about 33 nm, less than or equal to about 32 nm, less than or equal to about 31 nm, or less than or equal to about 30 nm. A cadmium free core-shell quantum dot emitting red light may have a full width at half maximum (FWHM) of greater than (or at least) 40 nm. In contrast, the NPL of an embodiment may exhibit a full width at half maximum (FWHM) of less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, or less than or equal to about 31 nm.

In the nanoplatelet according to an embodiment, the first semiconductor nanocrystal may include ZnA (wherein, A is selenium, tellurium, sulfur, oxygen, or a combination thereof), and the second semiconductor nanocrystal may include a Group III metal and phosphorus.

In the nanoplatelet, an amount of the Group III metal may be greater than or equal to about 0.05 moles, for example, greater than or equal to about 0.06 moles, greater than or equal to about 0.07 moles, greater than or equal to about 0.08 moles, greater than or equal to about 0.09 moles, greater than or equal to about 0.1 moles, greater than or equal to about 0.15 moles, greater than or equal to about 0.2 moles, greater than or equal to about 0.25 moles, greater than or equal to about 0.3 moles, greater than or equal to about 0.35 moles, greater than or equal to about 0.4 moles, greater than or equal to about 0.45 moles, greater than or equal to about 0.5 moles, greater than or equal to about 0.55 moles, greater than or equal to about 0.6 moles, greater than or equal to about 0.65 moles, greater than or equal to about 0.7 moles, greater than or equal to about 0.75 moles, or greater than or equal to about 0.8 moles, based on 1 mole of the element A.

The amount of the Group III metal may be less than or equal to about 2 moles, for example, less than or equal to about 1.9 moles, less than or equal to about 1.8 moles, less than or equal to about 1.7 moles, less than or equal to about 1.6 moles, less than or equal to about 1.5 moles, less than or equal to about 1.4 moles, less than or equal to about 1.3 moles, less than or equal to about 1.2 moles, less than or equal to about 1.1 moles, less than or equal to about 1 mole, or less than or equal to about 0.9 moles, based on 1 mole of the element A.

In the nanoplatelet, an amount of the zinc may be greater than or equal to about 1 mole, greater than or equal to about 1.5 moles, greater than or equal to about 2 moles, greater than or equal to about 2.5 moles, greater than or equal to about 3 moles, greater than or equal to about 3.5 moles, greater than or equal to about 4 moles, greater than or equal to about 4.5 moles, greater than or equal to about 5 moles, or greater than or equal to about 5.5 moles, based on 1 mole of the element A.

The amount of the zinc may be less than or equal to about 20 moles, less than or equal to about 19 moles, less than or equal to about 18 moles, less than or equal to about 17 moles, less than or equal to about 16 moles, less than or equal to about 15 moles, less than or equal to about 14 moles, less than or equal to about 13 moles, less than or equal to about 12 moles, less than or equal to about 10 moles, less than or equal to about 9 moles, less than or equal to about 8 moles, less than or equal to about 7 moles, or less than or equal to about 6 moles, based on 1 mole of the element A.

In the nanoplatelet, an amount of the phosphorus may be greater than or equal to about 0.05 moles, greater than or equal to about 0.06 moles, greater than or equal to about 0.07 moles, greater than or equal to about 0.08 moles, greater than or equal to about 0.09 moles, greater than or equal to about 0.1 moles, greater than or equal to about 0.11 moles, greater than or equal to about 0.12 moles, or greater than or equal to about 0.13 moles, based on 1 mole of the element A.

The amount of the phosphorus may be less than or equal to about 10 moles, less than or equal to about 9 moles, less than or equal to about 8 moles, less than or equal to about 7 moles, less than or equal to about 6 moles, less than or equal to about 5 moles, less than or equal to about 4.5 moles, less than or equal to about 4 moles, less than or equal to about 3.5 moles, less than or equal to about 3 moles, less than or equal to about 2.5 moles, less than or equal to about 2 moles, less than or equal to about 1.8 moles, based on 1 mole of the element A.

The NPL may include an organic ligand, organic solvent, or a combination thereof that will be described later on the surface of the NPL (e.g., bound to the surface of the NPL). The NPL may be dispersed in an organic solvent, which will be described later, and precipitated in a nonsolvent, which will be described later.

In an embodiment, a method of producing the aforementioned nanoplatelet includes reacting a first metal precursor and a first non-metal precursor for the first semiconductor nanocrystal in an organic solvent in the presence of an organic ligand at a temperature of less than about 175° C. to synthesize a two-dimensional template; and reacting a second metal precursor and a second non-metal precursor for the second semiconductor nanocrystal in an organic solvent in the presence of an organic ligand and the two-dimensional template at a temperature of less than or equal to about 200° C., for example, less than or equal to about 170° C., less than or equal to about 165° C. to form a first shell including the second semiconductor nanocrystal on a, e.g., at least one, surface of the two-dimensional template.

The method may further include reacting third metal and non-metal precursors for the third semiconductor nanocrystal in an organic solvent in the presence of an organic ligand and the particle on which the first shell is formed to form a second shell on the first shell at a shell-forming temperature.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR, $RPO(OH)_2$, RPOOH, RHPOOH, $R_2POOH$, or a combination thereof, wherein, R is the same or different and independently a substituted or unsubstituted C1 to C40 aliphatic hydrocarbon group (e.g., a C1 to C40 alkyl group, a C2 to C40 alkenyl group, a C2 to C40 alkynyl group), a substituted or unsubstituted C6 to C40 aromatic hydrocarbon group (e.g., a C6 to C20 aryl group). The organic ligand may coordinate with the surface of the obtained nanocrystal and may assist with dispersion of the nanoplatelet in the solution and/or affect photoluminescence and electrical characteristics of quantum dots. Examples of the organic ligand may include methane thiol, ethane thiol, propane thiol, butane thiol, pentane thiol, hexane thiol, octane thiol, dodecane thiol, hexadecane thiol, octadecane thiol, benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, or a substituted or unsubstituted octylphosphine (e.g., trioctylphosphine (TOP)); a phosphine oxide such as a substituted or unsubstituted methyl phosphine oxide (e.g., trimethyl phosphine oxide, methyldiphenyl phosphine oxide, etc.), a substituted or unsubstituted ethyl phosphine oxide (e.g., triethyl phosphine oxide, ethyldiphenyl phosphine oxide, etc.), a substituted or unsubstituted propyl phosphine oxide, a substituted or unsubstituted butyl phosphine oxide, or a substituted or unsubstituted octyl phosphine oxide (e.g., trioctylphosphine oxide (TOPO)); diphenyl phosphine, diphenyl phosphine oxide, triphenyl phosphine, triphenyl phosphine oxide; a C2 to C30 phosphonic acid; a C2 to C30 phosphinic acid; and the like but is not limited thereto. Two or more different organic ligand may be used. In the reaction for the formation of the template and first shell, the organic ligand may include primary amines with 6 or more carbon atoms. In the reaction for the formation of the template and first shell, two or more different organic ligand may be used.

The organic solvent may be a C6 to C22 primary amine such as hexadecylamine, oleylamine, and the like; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, or benzyl ether, or a combination thereof. Types and amounts of the solvent may be appropriately selected taking into consideration of types and amounts of precursors and organic ligands.

In an embodiment, during the formation of the template and first shell, the organic solvent may not include a tertiary amine including a, e.g., at least one (e.g., two or three), C6 to 20 alkyl group such as trioctylamine. In an embodiment, during the formation of the template and first shell, the organic solvent may not include an alkene compound such as octadecene. In an embodiment, the organic solvent may include an alkylphosphine including three C6 to C22 alkyl groups.

The (first, second, or third) metal precursors may be a metal powder, an alkylated metal, a metal carboxylate, a metal hydroxide, a metal halide, a metal oxide, a metal inorganic salt (e.g., nitrate, etc.), a metal sulfate, or a metal acetylacetonate, but are not limited thereto. The (first, second, or third) metal precursors may include a desired metal (e.g., zinc, indium, gallium, etc.) taking into consideration the compositions of the first semiconductor nanocrystal, the second semiconductor nanocrystal, and the third semiconductor nanocrystal.

The (first, second, or third) metal precursors may include a desired non-metal element taking into consideration the compositions of the first semiconductor nanocrystal, the second semiconductor nanocrystal, and the third semiconductor nanocrystal. The metal precursors may be in the form of suitable compounds for the synthesis of semiconductor nanocrystals, and are not particularly limited.

Hereinafter, a nanoplatelet optionally having a second shell including a first semiconductor nanocrystal including zinc selenide, a second semiconductor nanocrystal including indium and phosphorus, and optionally a third semiconductor nanocrystal including zinc and a chalcogen element (e.g., sulfur, selenium, or a combination thereof) is described, but is not limited thereto.

In an embodiment, types of the zinc precursor may be appropriately selected. Examples of the zinc precursor may include a Zn metal powder (e.g., dimethylzinc, diethylzinc, etc.), an alkylated Zn compound, a Zn alkoxide, a Zn carboxylate, a Zn nitrate, Zn perchlorate, Zn sulfate, Zn acetylacetonate, a Zn halide, a Zn cyanide, a Zn hydroxide, a Zn oxide, a Zn peroxide, or a combination thereof. Two or more different zinc precursor may be used.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof but is not limited thereto.

Types of the indium precursor may be appropriately selected. Examples of the indium precursor may be trimethyl indium, indium carboxylate such as indium acetate, indium palmitate, indium stearate, and the like, indium hydroxide, indium chloride, indium oxide, indium nitrate, indium sulfate, or a combination thereof.

Types of the gallium precursor may be appropriately selected. Examples of the gallium precursor may be trimethyl gallium, gallium carboxylate such as gallium acetate, gallium palmitate, gallium stearate, and the like, gallium hydroxide, gallium chloride, gallium oxide, gallium nitrate, gallium sulfate, or a combination thereof.

Types of the phosphorus precursor may be appropriately selected. Examples of the phosphorus precursor may be tris(trimethylsilyl)phosphine, tris(dimethylamino) phosphine, triethylphosphine, tributylphosphine, trioctylphosphine, triphenylphosphine, tricyclohexylphosphine, or a combination thereof.

In order to form a second dimensional template, the reaction may be performed at a temperature of less than about 175° C., for example, less than or equal to about 170° C., less than or equal to about 165° C., less than or equal to about 160° C., less than or equal to about 155° C., less than or equal to about 150° C., less than or equal to about 145° C., less than or equal to about 140°. The reaction temperature may be greater than or equal to about 100° C., for example, greater than or equal to about 120° C., or greater than or equal to about 130° C. The reaction time may be appropriately selected, but is not particularly limited. The reaction time may be less than about 2 hour, for example, less than about 1.5 hour, less than about 1 hour, less than or equal to about 50 minutes. The reaction time may be greater than or equal to about 20 minutes, for example, greater than or equal to about 30 minutes.

In order for indium phosphide or the like to be formed as a first shell having a desirable thickness on the template rather than forming a particle, the reaction may be performed at a temperature of less than or equal to about 200° C., for example, less than or equal to about 175° C., less than or equal to about 170° C., less than or equal to about 165° C., less than or equal to about 160° C., less than or equal to about 155° C., less than or equal to about 150° C., less than or equal to about 145° C., or less than or equal to about 140° C. The reaction temperature may be greater than or equal to about 100° C., for example, greater than or equal to about 120° C. The reaction time may be appropriately selected, but is not particularly limited. The reaction time may be less than about 1 hour, for example, less than or equal to about 50 minutes. The reaction time may be greater than or equal to about 20 minutes, for example, greater than or equal to about 30 minutes.

After forming the template and/or forming the first shell, the obtained resulting product may be separated by adding a nonsolvent, but is not limited. The method may be performed with a sequential process without performing the separating process. When separating the template, the first shell-formed particle (the particle comprising the first shell formed on the surface of the template), or a combination thereof, or separating the final NPL, organic ligand-coordinated nanocrystal particles may be separated (e.g., precipitated) by adding a nonsolvent which will be described later into the obtained final reaction solution. The separated product may be washed using the nonsolvent. The nonsolvent may be a polar solvent that is miscible with the solvent used in the reaction and in which nanocrystals are not dispersible. The nonsolvent may be selected taking into consideration the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separation may be performed through a centrifugation, precipitation, chromatography, or distillation. The separated nanocrystal may be added to a washing solvent and washed, if desired. The washing solvent has no particular limit and may have a similar solubility parameter to that of the ligand and may, for example, include hexane, heptane, octane, chloroform, toluene, benzene, and the like.

In each process, amounts of the precursors and organic ligands used may be determined in consideration of the final NPL composition, thickness of each layer, precursor reactivity, and the like.

An embodiment provides a composition including the aforementioned NPL, a composite including the aforementioned NPL, or a combination thereof.

A composition according to an embodiment includes (e.g., a plurality of) semiconductor nanocrystal particle(s);

optionally a dispersing agent (e.g., a binder including a carboxylic acid group); and optionally a (organic) solvent, wherein the semiconductor nanocrystal particles includes the aforementioned nanoplatelet. The dispersing agent may include a binder monomer or polymer including a carboxylic acid group. The composition may further include a (photo) polymerizable monomer including a carbon-carbon double bond and optionally a (thermal or photo) initiator.

An amount of the aforementioned semiconductor nanocrystal particles (or NPL, hereinafter semiconductor nanocrystal particles may also refer to NPL) in the composition may be appropriately adjusted taking into consideration a desirable final use (e.g., color filter, etc.). In an embodiment, the amount of the semiconductor nanocrystal particles may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt % based on a solid content of the composition (e.g., based on the total weight of the solids in the composition). The amount of the semiconductor nanocrystal particles may be less than or equal to about 70 wt %, for example, less than or equal to about 65 wt %, less than or equal to about 60 wt %, less than or equal to about 55 wt %, or less than or equal to about 50 wt % based on a solid content of the composition. As used herein, the solid content of the composition may represent an amount of a given component in the composite, which will be further described below.

The composition according to an embodiment may be used to produce a pattern of the semiconductor nanocrystal-polymer composite. The composition according to an embodiment may be a photoresist composition including the semiconductor nanocrystal particles to which a photolithography method may be applied. The composition according to an embodiment may be an ink composition that may provide a pattern by printing (e.g., a droplet discharge method such as inkjet printing). The composition according to an embodiment may not include a conjugated polymer (except a cardo binder that will be described later). The composition according to an embodiment may include a conjugated polymer. Herein, the conjugated polymer may refer to a polymer having a conjugation double bond in a main chain of the polymer (e.g., polyphenylenevinylene, etc.).

In the composition according to an embodiment, the dispersing agent or the binder monomer or polymer may include a carboxylic acid group. The binder polymer may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure in which two aromatic rings are bound to a quaternary carbon atom that is a constituent atom of another cyclic moiety in the main chain and including a carboxylic acid group (—COOH) (hereinafter, a cardo binder); or a combination thereof.

The copolymer may include a first repeating unit derived from the first monomer and a second repeating unit derived from the second monomer, and optionally a third repeating unit derived from the third monomer.

The polymer including the carboxylic acid group may include a multiple aromatic ring-containing polymer. The multiple aromatic ring-containing polymer is known as a cardo binder resin and may commercially available.

In the composition, an amount of the binder polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt % based on a total weight of the composition or a solid content, but is not limited thereto. The amount of the binder polymer may be less than or equal to about 55 wt %, less than or equal to about 35 wt %, for example, less than or equal to about 33 wt %, or less than or equal to about 30 wt % based on a total weight of the composition or a solid content.

In the composition, the polymerizable (e.g., photopolymerizable) monomer including the carbon-carbon double bond may include a (e.g., photopolymerizable) acryl-based monomer. The monomer may be a precursor for an insulating polymer. An amount of the monomer may be greater than or equal to about 0.5 wt %, for example, greater than or equal to about 1 wt %, or greater than or equal to about 2 wt % based on a total weight of the composition or a solid content. An amount of the photopolymerizable monomer may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt % based on a total weight of the composition or a solid content.

The initiator in the composition may be used for polymerization of the aforementioned monomers. The initiator is a compound accelerating a radical reaction (e.g., radical polymerization of monomer) by producing radical chemical species under a mild condition (e.g., by heat or light). The initiator may be a thermal initiator or a photoinitiator.

In the composition, an amount of the initiator may be appropriately adjusted taking into consideration types and amounts of the polymerizable monomers. In an embodiment, the initiator may be used in an amount of about 0.01 wt % to about 10 wt % based on a total weight of the composition, but is not limited thereto.

The composition may further include a (multiple or mono-functional) thiol compound having a, e.g., at least one, thiol group at the terminal end, a metal oxide particulate, or a combination thereof.

The metal oxide particulate may include $TiO_2$, $SiO_2$, $BaTiO_3$, $Ba_2TiO_4$, $ZnO$, or a combination thereof. In the composition, an amount of the metal oxide may be greater than or equal to about 1 wt % and less than or equal to about 35 wt %, less than or equal to about 25 wt %, less than or equal to about 10 wt %, or less than or equal to about 5 wt % based on a solid content of the composition. A diameter of the metal oxide particulate is not particularly limited and may be appropriately selected. A diameter of the metal oxide particulate may be greater than or equal to about 100 nm, for example, greater than or equal to about 150 nm, or greater than or equal to about 200 nm and less than or equal to about 1,000 nm, or less than or equal to about 800 nm.

An amount of the thiol compound may be less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt % based on a total weight of the composition or a solid content. The amount of the thiol compound may be greater than or equal to about 0.1 wt %, for example, greater than or equal to about 0.5 wt % or greater than or equal to about 1 wt % based on a total weight of the composition.

The composition may further include an organic solvent (or a liquid vehicle). Types of the usable organic solvent are not particularly limited. A type and an amount of the organic solvent may be appropriately determined by taking into consideration the aforementioned main components (i.e., the semiconductor nanocrystal particles, the dispersing agent, the polymerizable monomer, the initiator, and if used, the thiol compound,) and a type and an amount of an additive which is described later. The composition may include a solvent in a residual amount except for a desired amount of the (non-volatile) solid. If desired, the composition may further include various additives such as a light diffusing agent, a leveling agent, or a coupling agent in addition to the aforementioned components. An amount of the additives is not particularly limited, and may be controlled within an appropriate range wherein the additive does not cause an adverse effect on preparation of the composition and production of the semiconductor nanocrystal-polymer composite and optionally a patterning of the composite.

If used, the additives may be used in an amount of greater than or equal to about 0.1 wt %, for example, greater than or equal to about 0.5 wt %, greater than or equal to about 1 wt %, greater than or equal to about 2 wt %, or greater than or equal to about 5 wt % based on a total weight of the composition, but is not limited thereto. If used, the amount of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt % based on a total weight of the composition, but is not limited thereto.

Specific types of the composition, for example the first monomer, second monomer, third monomer, polymer including the carboxylic acid group, acryl-based monomer, initiator, solvent, poly thiol compound, various additives, and the like, preparation of the composition, and the like may refer to US-2017-0059988-A1, the content of which in its entirety is herein incorporated by reference.

The composition may provide a semiconductor nanocrystal-polymer composite by a (e.g., radical) polymerization. Accordingly, in an embodiment, the semiconductor nanocrystal-polymer composite includes a polymer matrix; and a plurality of semiconductor nanocrystal particles dispersed in the polymer matrix, wherein the plurality of semiconductor nanocrystal particles include the aforementioned nanoplatelet.

The polymer matrix may include a dispersing agent (e.g., a binder polymer including a carboxylic acid group), a polymerization product (e.g., an insulating polymer) of a polymerizable monomer having a (at least one, for example, at least two, at least three, at least four, or at least five) carbon-carbon double bond, a polymerization product of the polymerizable monomer and a poly thiol compound having at least two thiol groups at the terminal end, a metal oxide particulate(s), or a combination thereof.

In an embodiment, the polymer matrix may include a cross-linked polymer and a dispersing agent (e.g., (carboxyl group-containing) binder polymer). The polymer matrix may not include a conjugated polymer (excepting cardo resin). The cross-linked polymer may include a thiolene resin, a cross-linked poly(meth)acrylate, or a combination thereof. In an embodiment, the cross-linked polymer may be a polymerization product of the aforementioned polymerizable monomer and, optionally, the poly thiol compound.

The nanoplatelet, the dispersing agent or binder polymer, the polymerizable monomer, and the poly thiol compound are the same as described above.

The film of the semiconductor nanocrystal-polymer composite or the semiconductor nanocrystal-polymer composite pattern that will be described later may have for example a thickness, less than or equal to about 30 μm, for example less than or equal to about 25 μm, less than or equal to about 20 μm, less than or equal to about 15 μm, less than or equal to about 10 μm, less than or equal to about 8 μm, less than or equal to about 7 μm and greater than about 2 μm, for example, greater than or equal to about 3 μm, greater than or equal to about 3.5 μm, or greater than or equal to about 4 μm.

In an embodiment, a patterned film includes a repeating section including a first section emitting first light, wherein the first section includes the aforementioned semiconductor nanocrystal-polymer composite. The repeating section may include a second section emitting second light having different wavelength from the first light, wherein the second section may include a semiconductor nanocrystal-polymer composite. The semiconductor nanocrystal-polymer composite of the second section may include a second semiconductor nanocrystal particle configured to emit the second light. The second semiconductor nanocrystal particle may include the aforementioned nanoplatelet. The first light or the second light may be red light having a maximum emission peak wavelength which is present between about 600 nm and about 650 nm (e.g., about 620 nm to about 650 nm) or green light having a maximum emission peak wavelength which is present between about 500 nm and about 550 nm (e.g., about 510 nm to about 540 nm). The patterned film may further include a third section emitting or passing third light (e.g., blue light) different from the first light and the second light. The third light may have a maximum peak wavelength ranging from about 380 nm to about 480 nm.

In an embodiment, a display device includes a light source and a photoluminescence element, and the photoluminescence element includes a substrate and an emission layer disposed on the substrate, and the emission layer includes a film or patterned film of the semiconductor nanocrystal-polymer composite. The light source is configured to provide the photoluminescence element with incident light. The incident light may have an emission peak wavelength of greater than or equal to about 440 nm, for example, greater than or equal to about 450 nm and less than or equal to about 500 nm, for example, less than or equal to about 480 nm, less than or equal to about 470 nm, or less than or equal to about 460 nm.

In the emission layer (e.g., patterned film of the semiconductor nanocrystal-polymer composite) of the device according to an embodiment, the first section may be a section emitting red light, and the second section may be a section emitting green light, and the light source may be an element emitting blue light.

Optical elements (blue light blocking layer or first optical filter layer which will be described later) for blocking (e.g., reflecting or absorbing) blue light may be disposed on front surfaces (light-emitting surfaces) of the first section and the second section.

In the aforementioned display device, the light source includes a plurality of light emitting units respectively corresponding to the first section and the second section, and the light emitting units may include a first electrode and a second electrode facing each other and an electroluminescence layer disposed between the first electrode and the second electrode. The electroluminescence layer may include an organic light emitting material. For example, each light emitting unit of the light source may include an electroluminescent device (e.g., an organic light emitting diode (OLED)) structured to emit light of a predetermined wavelength (e.g., blue light, green light, or a combination thereof). Structures and materials of the electroluminescent device and the organic light emitting diode (OLED) are not particularly limited. The light source includes an organic light emitting diode (OLED) emitting blue light (and optionally, green light).

Figure 3:
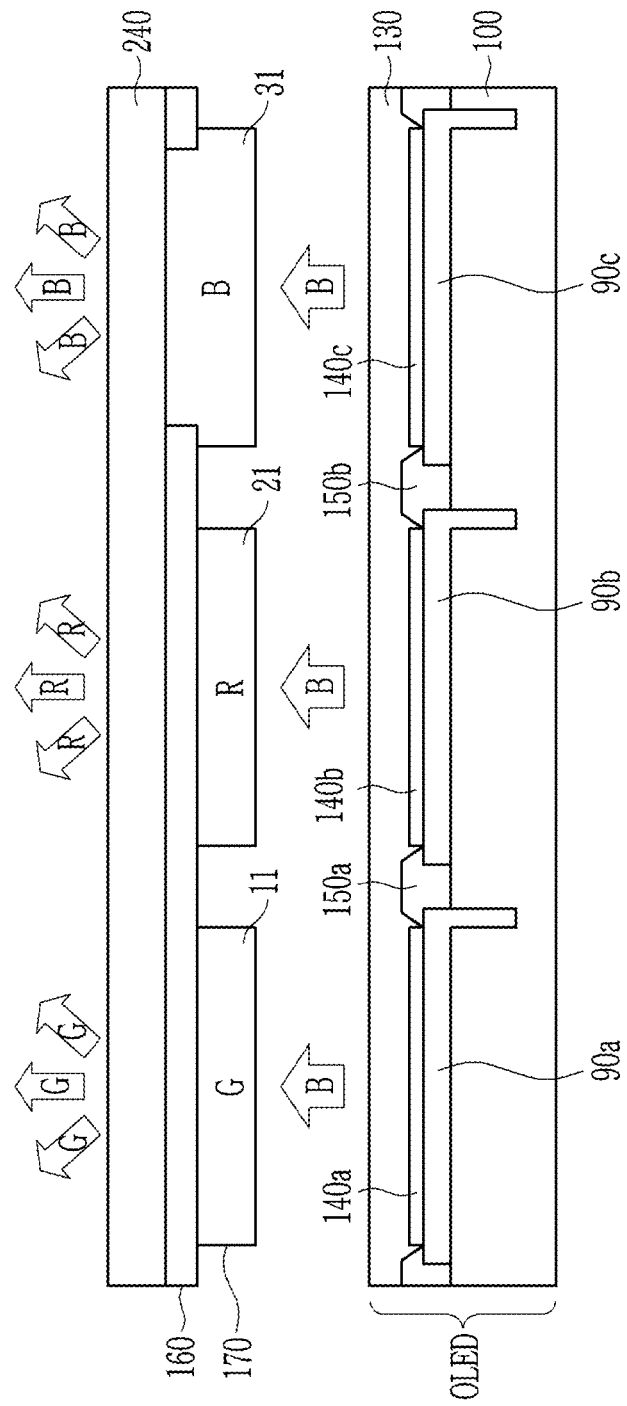
FIG. 3 is a schematic cross-sectional view of a device according to an embodiment.
Figure 4:
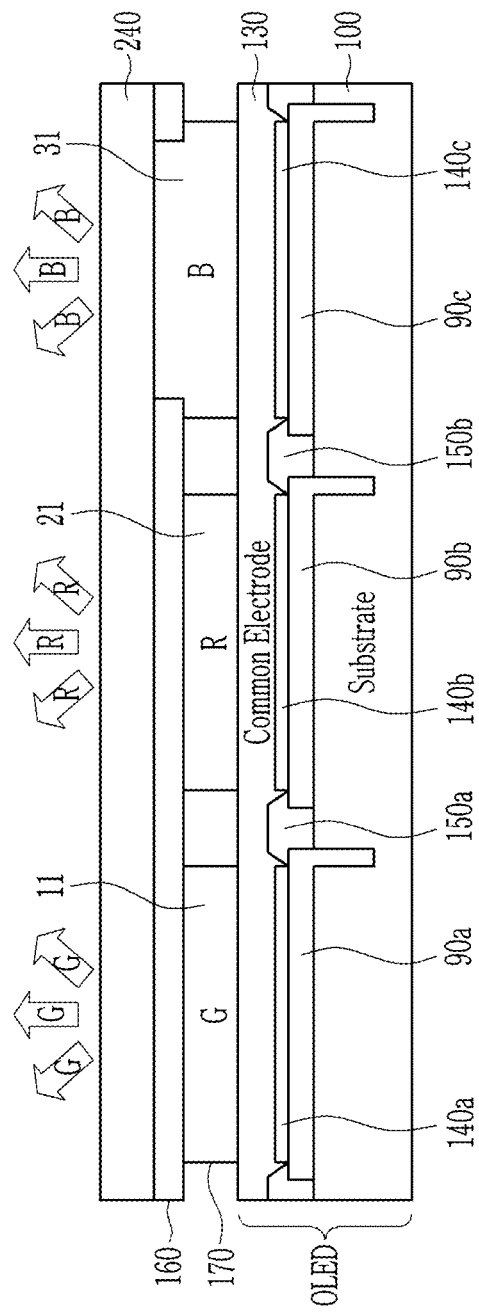
FIG. 4 is a schematic cross-sectional view of a device according to an embodiment.

FIGS. 3 and 4 are schematic cross-sectional views of display devices according to a non-limiting embodiment. Referring to FIGS. 3 and 4, a light source may include an organic light emitting diode (OLED) emitting blue light. The organic light emitting diode OLED may include (at least two, for example, three or more) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c.

A thin film transistor and a substrate may be disposed under the organic light emitting diode (OLED). The pixel areas of the OLED may be disposed corresponding to the first, second, and third sections that will be described in detail below, respectively.

The stacked structure that includes a semiconductor nanocrystal-polymer composite pattern (e.g., including a first repeating section including green light emitting nanoplatelets, a second repeating section including red light emitting nanoplatelets, or a combination thereof) and a substrate, or the semiconductor nanocrystal-polymer composite pattern, may be disposed on or over a light source, for example, directly on the light source.

The first and the second sections are configured so that blue light emitted from the light source is entered thereinto and red light and green light may be emitted therefrom, respectively. Blue light emitted from the light source may pass through the third section.

The light (e.g., blue light) emitted from the light source may enter the second section 21 and the first section 11 of the pattern 170 to emit (e.g., converted) red light R and green light G, respectively. The blue light B emitted from the light source passes through or transmits from the third section 31. Over the second section 21 emitting red light, the first section 11 emitting green light, or a combination thereof, an optical element 160 may be disposed. The optical element may be a blue cut layer which cuts (e.g., reflects or absorbs) blue light and optionally green light, or a first optical filter layer. The blue cut layer 160 may be disposed on the upper substrate 240. The blue cut layer 160 may be disposed between the upper substrate 240 and the quantum dot-polymer composite pattern and over the first section 11 and the second section 21. Details of the blue cut layer are the same as set forth for the first optical filter layer 310 below.

The device may be obtained by separately manufacturing the aforementioned stacked structure and (e.g., blue light emitting) LED or OLED and then assembling the same. Alternatively, the device may be obtained by forming a semiconductor nanocrystal-polymer composite pattern directly on the LED or OLED.

The substrate may be a substrate including an insulating material. The substrate may include glass; various polymers such as polyester of polyethylene terephthalate (PET), or polyethylene naphthalate (PEN), polycarbonate, and polyacrylate; polysiloxane (e.g., polydimethylsiloxane (PDMS)); an inorganic material such as $Al_2O_3$ or ZnO; or a combination thereof, but is not limited thereto. A thickness of the substrate may be appropriately selected taking into consideration a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the semiconductor nanocrystal particle.

A wire layer including a thin film transistor or the like is formed on the substrate. The wire layer may further include a gate line, a sustain voltage line, a gate insulating layer, a data line, a source electrode, a drain electrode, a semiconductor, a protective layer, and the like. The detail structure of the wire layer may be verified according to an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described later.

The pixel electrode may function as an anode of the display device. The pixel electrode may be formed of a transparent conductive material such as indium tin oxide (ITO) or indium zinc oxide (IZO). The pixel electrode may be formed of a material having a light-blocking properties such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure in which the aforementioned transparent conductive material and material having light-blocking properties are stacked sequentially.

Between two adjacent pixel electrodes, a pixel define layer (PDL) overlaps with a terminal end of the pixel electrode to divide the pixel electrode into a pixel unit. The pixel define layer is an insulation layer which may electrically block the at least two pixel electrodes.

The pixel define layer covers a portion of the upper surface of the pixel electrode, and the remaining region of the pixel electrode not covered by the pixel define layer may provide an opening. An organic emission layer that will be described later may be formed on the region defined by the opening.

The organic emission layer defines each pixel area by the aforementioned pixel electrode and the pixel define layer. In other words, one pixel area may be defined as an area formed with one organic emission unit layer which is contacted with one pixel electrode divided by the pixel define layer.

For example, in the display device according to an embodiment, the organic emission layer may be defined as a first pixel area, a second pixel area and a third pixel area, and each pixel area is spaced apart from each other leaving a predetermined interval by the pixel define layer.

In an embodiment, the organic emission layer may emit a third light belonging to, e.g., in, a visible light wavelength region or belonging to, e.g., in, a UV wavelength region. That is, each of the first to the third pixel areas of the organic emission layer may emit third light. In an embodiment, the third light may be a light having the highest energy in the visible light wavelength region, for example, may be blue light. When all pixel areas of the organic emission layer are designed to emit the same light, each pixel area of the organic emission layer may be all formed of the same or similar materials or may show the same or similar properties. As such, a process difficulty of forming the organic emission layer may be relieved, and the display device may be applied for, e.g., formed by, a large scale/large area process. However, the organic emission layer according to an embodiment is not limited thereto, but the organic emission layer may be designed to emit at least two different lights.

The organic emission layer includes an organic emission unit layer in each pixel area, and the each organic emission unit layer may further include an auxiliary layer (e.g., hole injection layer (HIL), hole transport layer (HTL), electron transport layer (ETL), etc.) besides the emission layer.

The common electrode may function as a cathode of the display device. The common electrode may be formed of a transparent conductive material such as indium tin oxide (ITO) or indium zinc oxide (IZO). The common electrode may be formed on the organic emission layer and may be integrated therewith.

A planarization layer or a passivation layer (not shown) may be formed on the common electrode. The planarization layer may include a (e.g., transparent) insulating material for ensuring electrical insulation with the common electrode.

In an embodiment, the display device may further include a lower substrate, a polarizer disposed under the lower substrate, and a liquid crystal layer disposed between the stacked structure and the lower substrate, and in the stacked structure, the light emission layer may be disposed to face the liquid crystal layer. The display device may further include a polarizer between the liquid crystal layer and the emission layer. The light source may further include LED and if desired, a light guide panel.

Figure 5:
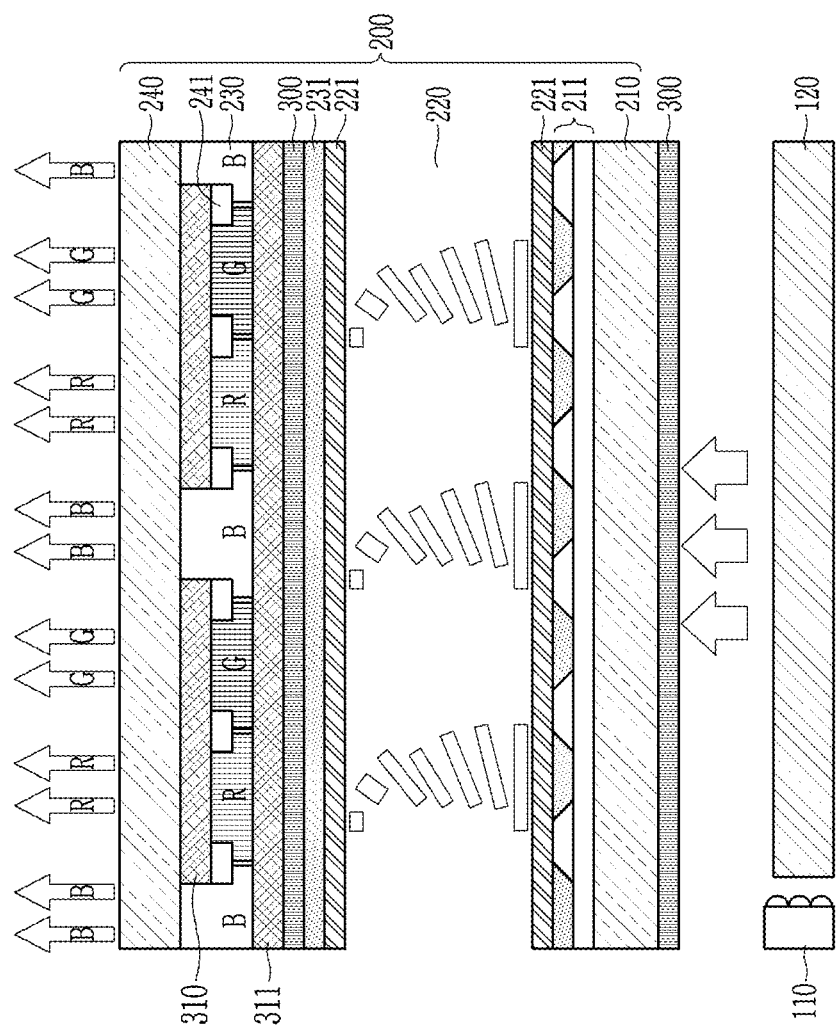
FIG. 5 is a schematic cross-sectional view of a device according to an embodiment.

Non-limiting examples of the display device (e.g., a liquid crystal display device) according to an embodiment are illustrated with a reference to the drawing. FIG. 5 is a schematic cross sectional view showing a liquid crystal display according to an embodiment. Referring to FIG. 5, the display device of an embodiment includes a liquid crystal panel 200, a polarizer 300 disposed under the liquid crystal panel 200, and a backlight unit (BLU) disposed under the polarizer 300.

The liquid crystal panel 200 includes a lower substrate 210, a stacked structure, and a liquid crystal layer 220 disposed between the stacked structure and the lower substrate. The stacked structure includes a transparent substrate 240 and a photoluminescent layer 230 including a pattern of a quantum dot polymer composite.

The lower substrate 210 that is also referred to as an array substrate may be a transparent insulating material substrate. The substrate is the same as described above. A wire plate 211 is provided on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal layer 220 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are not particularly limited.

A lower polarizer 300 is provided under the lower substrate. Materials and structures of the polarizer 300 are not particularly limited. A backlight unit (e.g., emitting blue light) may be disposed under the polarizer 300.

An upper optical element or an upper polarizer 300 may be provided between the liquid crystal layer 220 and the transparent substrate 240, but is not limited thereto. For example, the upper polarizer may be disposed between the liquid crystal layer 220 and the light emission layer 230. The polarizer may be any polarizer that used in a liquid crystal display device. The polarizer may be TAC (triacetyl cellulose) having a thickness of less than or equal to about 200 μm, but is not limited thereto. In an embodiment, the upper optical element may be a coating that controls a refractive index without a polarization function.

The backlight unit includes a light source 110. The light source may emit blue light or white light. The light source may include a blue LED, a white LED, a white OLED, or a combination thereof, but is not limited thereto.

The backlight unit may further include a light guide panel 120. In an embodiment, the backlight unit may be an edge-type lighting. For example, the backlight unit may include a reflector (not shown), a light guide panel (not shown) provided on the reflector and providing the liquid crystal panel 200 with a planar light source, an, e.g., at least one, optical sheet (not shown) on the light guide panel, for example, a diffusion plate, a prism sheet, and the like, or a combination thereof, but is not limited thereto. The backlight unit may not include a light guide panel. In an embodiment, the backlight unit may be a direct lighting. For example, the backlight unit may have a reflector (not shown), and may have a plurality of fluorescent lamps disposed on the reflector at regular intervals, or may have an LED operating substrate on which a plurality of light emitting diodes may be disposed, a diffusion plate thereon, and optionally a, e.g., at least one, optical sheet. Details (e.g., each component of a light emitting diode, a fluorescent lamp, light guide panel, various optical sheets, and a reflector) of such a backlight unit are not particularly limited.

A black matrix 241 is provided under the transparent substrate 240 and has openings and hides a gate line, a data line, and a thin film transistor of the wire plate on the lower substrate. For example, the black matrix 241 may have a lattice shape. The photoluminescent layer 230 is provided in the openings of the black matrix 241 and has a semiconductor nanocrystal-polymer composite pattern including a first section (R) configured to emit first light (e.g., red light), a second section (G) configured to emit second light (e.g., green light), and a third section (B) configured to emit/transmit, for example blue light. If desired, the photoluminescent layer may further include a, e.g., at least one, fourth section. The fourth section may include a semiconductor nanocrystal (or NPL) that emits different color from light emitted from the first to third sections (e.g., cyan, magenta, and yellow light).

In the light emission layer 230, sections forming a pattern may be repeated corresponding to pixel areas formed on the lower substrate. A transparent common electrode 231 may be provided on the photoluminescent color filter layer (e.g., the photoluminescent layer 230).

The third section (B) configured to emit/transmit blue light may be a transparent color filter that does not change a light emitting spectrum of the light source. In this case, blue light emitted from the backlight unit may enter in a polarized state and may be emitted through the polarizer and the liquid crystal layer as is. If desired, the third section may include a NPL emitting blue light.

If desired, the display device may further include a light blocking layer (blue light blocking layer or blue cut filter) or a first optical filter layer 310. The blue light blocking layer may be disposed between bottom surfaces of the first section (R) and the second section (G) and the upper substrate 240 or on a top surface of the upper substrate 240. The blue light blocking layer may include a sheet having openings that correspond to a pixel area showing a blue color (e.g., third section) and may be formed on portions corresponding to the first and second sections. As shown in FIG. 5, the first optical filter layer 310 may be integrally formed as one body structure at the remaining positions except positions overlapped with the third section, but is not limited thereto. At least two first optical filter layers may be spaced apart and be disposed on each of the positions overlapped with the first and the second sections.

For example, the first optical filter layer may block light in the visible light wavelength region, e.g., in a certain visible light wavelength region, and transmit light in other wavelength regions, e.g., other than the certain visible light wavelength region. For example, the first optical filter layer may block blue light and transmit light except for blue light. For example, the first optical filter layer may transmit green light, red light, yellow light that is mixed light thereof, or a combination of green light, red light, and yellow light.

For example, the first optical filter layer may substantially block blue light having a wavelength of less than or equal to about 500 nm and may transmit light in other visible light wavelength regions of greater than about 500 nm and less than or equal to about 700 nm.

For example, the first optical filter layer may have light transmittance of greater than or equal to about 70%, greater than or equal to about 80%, greater than or equal to about 90%, or about 100% with respect to the other visible light of greater than about 500 nm and less than or equal to about 700 nm.

The first optical filter layer may include a polymer thin film including a dye that absorbs light having a wavelength to be blocked, a pigment that absorbs light having a wavelength to be blocked, or a combination thereof. The first optical filter layer may block at least 80%, at least 90%, or at least 95% of blue light having a wavelength of less than or equal to about 480 nm and the first optical filter layer may have light transmittance of greater than or equal to about 70%, greater than or equal to about 80%, greater than or equal to about 90%, or about 100% with respect to other visible light of greater than about 500 nm and less than or equal to about 700 nm.

The first optical filter layer may block (e.g., absorb) and substantially block blue light having a wavelength of less than or equal to about 500 nm and for example may selectively transmit green light or red light. In this case, at least two first optical filter layers may be spaced apart and disposed on each of the portions overlapped with the first and second sections, respectively. For example, a first optical filter layer selectively transmitting red light may be disposed on the portion overlapped with the section emitting red light and the first optical filter layer selectively transmitting green light may be disposed on the portion overlapped with the section emitting green light, respectively. For example, the first optical filter layer may include a first region, a second region, or a combination thereof wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). The first region may be disposed at a place overlapped with the section emitting green light and the second region may be disposed at a place overlapped with the section emitting red light. The first region and the second region may be optically isolated. The first optical filter (layer) may contribute to improving color purity of a display device.

The first optical filter layer may be a reflective filter including a plurality of layers (e.g., inorganic material layers) with different reflective index. For example two layers having different refractive index may be alternately stacked with each other, or for example a layer having a high refractive index and a layer having a low refractive index may be alternately stacked with each other As refractive index difference between the layer having a high refractive index and the layer having a low refractive index is higher, the first optical filter layer having higher wavelength selectivity may be provided. A thickness and the stacked number of the layer having a high refractive index and the layer having a low refractive index may be determined according to a refractive index of each layer and a reflected wavelength, for example, each layer having a high refractive index may have a thickness of about 3 nm to about 300 nm, and each layer having a low refractive index may have a thickness of about 3 nm to about 300 nm.

A total thickness of the first optical filter layer may be, for example, from about 3 nm to about 10,000 nm, about 300 nm to about 10,000 nm, or about 1,000 nm to about 10,000 nm. All layers having a high refractive index may have the same thickness and the same material or thicknesses and/or materials different from each other, and all layers having a low refractive index may have the same thickness and the same material or thicknesses and/or materials different from each other.

The display device may further include a second optical filter layer (e.g., red/green or yellow light recycling layer) disposed between the light emission layer and the liquid crystal layer (e.g., between light emission layer and upper polarizer) and transmitting at least a portion of the third light and reflecting at least a portion of the first light and the second light. The second optical filter layer may reflect light in a wavelength region of greater than about 500 nm. The first light may be red light, the second light may be green light, and the third light may be blue light.

In the display device according to an embodiment, the second optical filter layer may be formed as an integrated one layer having a relatively planar surface.

In an embodiment, the second optical filter layer may include a monolayer having a low refractive index, for example, the second optical filter layer may be a transparent thin film having a refractive index of less than or equal to about 1.4, less than or equal to about 1.3, or less than or equal to about 1.2.

The second optical filter layer having a low refractive index may be (e.g., include or consist of), for example, a porous silicon oxide, a porous organic material, a porous organic/inorganic composite, or a combination thereof.

In an embodiment, the second optical filter layer may include a plurality of layers having different refractive indexes, for example, the second optical filter layer may be formed by alternately stacking two layers having different refractive indexes, or for example, the second optical filter layer may be formed by alternately stacking a material having a high refractive index and a material having a low refractive index.

The layer having a high refractive index in the second optical filter layer may include, for example, hafnium oxide, tantalum oxide, titanium oxide, zirconium oxide, magnesium oxide, cesium oxide, lanthanum oxide, indium oxide, niobium oxide, aluminum oxide, silicon nitride, or a combination thereof, but according to an embodiment, the layer having a high refractive index in the second optical filter layer may include a variety of materials having a higher refractive index than the layer having a low refractive index.

The layer having a low refractive index in the second optical filter layer may include, for example, a silicon oxide, but according to an embodiment, the layer having a low refractive index in the second optical filter layer may include a variety of materials having a lower refractive index than the layer having a high refractive index.

As the refractive index difference between the layer having a high refractive index and the layer having a low refractive index is the higher, the second optical filter layer may have the higher wavelength selectivity.

In the second optical filter layer, each thickness of the layer having a high refractive index and the layer having a low refractive index and the stacked number thereof may be determined taking into consideration a refractive index of each layer and the reflected wavelength, for example, each layer having a high refractive index in the second optical filter layer may have a thickness of about 3 nm to about 300 nm, and each layer having a low refractive index in the second optical filter layer may have a thickness of about 3 nm to about 300 nm. A total thickness of the second optical filter layer may be, for example, from about 3 nm to about 10,000 nm, about 300 nm to about 10,000 nm, or about 1,000 nm to about 10,000 nm. Each of the layer having a high refractive index and the layer having a low refractive index in the second optical filter layer may have the same thickness and materials or different thickness and materials from each other.

The second optical filter layer may reflect a, e.g., at least one, portion of the first light (R) and the second light (G) and transmit a, e.g., at least one, portion (e.g., whole part) of the third light (B). For example, the second optical filter layer may transmit only the third light (B) in a blue light wavelength region of less than or equal to about 500 nm and light in a wavelength region of greater than about 500 nm, that is, green light (G), yellow light, red light (R), and the like may be not passed through the second optical filter layer and reflected. Thus the reflected green light and red light may pass through the first and the second sections to be emitted to the outside of the display device 10.

The second optical filter layer may reflect a light in a wavelength region of greater than about 500 nm in greater than or equal to about 70%, greater than or equal to about 80%, or greater than or equal to about 90%, or about 100%.

Meanwhile, the second optical filter layer may have a transmittance to a light in a wavelength region of less than or equal to about 500 nm of, for example, greater than or equal to about 90%, greater than or equal to about 92%, greater than or equal to about 94%, greater than or equal to about 96%, greater than or equal to about 98%, greater than or equal to about 99%, or about 100%.

In an embodiment, the aforementioned stacked structure may be manufactured by a method using the photoresist composition. When the semiconductor nanocrystal-polymer composite pattern has a plurality of repeating sections, a plurality of compositions including semiconductor nanocrystal particles (e.g., a red light emitting NPL, a green light emitting NPL, or optionally a blue light emitting NPL) having desired photoluminescence properties (emission peak wavelength, etc.) for forming each repeating section are prepared, and then a pattern formation process for each NPL composition may be repeated (e.g., twice or more or three times or more) to obtain a desired pattern of the semiconductor nanocrystal-polymer composite. For example, the pattern of the semiconductor nanocrystal-polymer composite may have a pattern in which at least two different color sections (e.g., RGB color sections) are repeated. Such a semiconductor nanocrystal-polymer composite pattern may be used as a photoluminescence-type color filter in a display device.

In an embodiment, the aforementioned stacked structure may be produced using an ink composition. The method may include depositing the same (e.g., to provide a desirable pattern) on the desirable substrate using an appropriate system (e.g., droplet discharging device such as inkjet or nozzle printing device) and heating the same to remove a solvent and to perform a polymerization. The method may provide a highly precise semiconductor nanocrystal-polymer composite film or pattern in a simple way in a short time.

An embodiment provides an electronic device including the aforementioned NPL. The electronic device may include a light emitting diode (LED), an organic light emitting diode (OLED), a sensor, a solar cell, an imaging sensor, or a liquid crystal display (LCD), but is not limited thereto.

Hereinafter, embodiments are illustrated in more detail with reference to examples. However, they are exemplary embodiments of the present disclosure, and the present disclosure is not limited thereto.

EXAMPLES

Analysis Methods
1. Ultraviolet-Visible (UV-Vis) Spectroscopy Analysis

An ultraviolet (UV) spectroscopy Analysis is performed using an Agilent Cary 5000 spectrometer and obtain a UV-Visible absorption spectrum.

2. Inductively Coupled Plasma Atomic Emission Spectroscopy (ICP-AES) Analysis

Using Shimadzu ICPS-8100, an inductively coupled plasma atom light emitting spectroscopy (ICP-AES) analysis is performed.

3. Transmission Electron Microscopy (TEM) Analysis

Transmission electron microscopy analysis is performed using a Titan ChemiSTEM electron microscope.

Example 1

Figure 6:
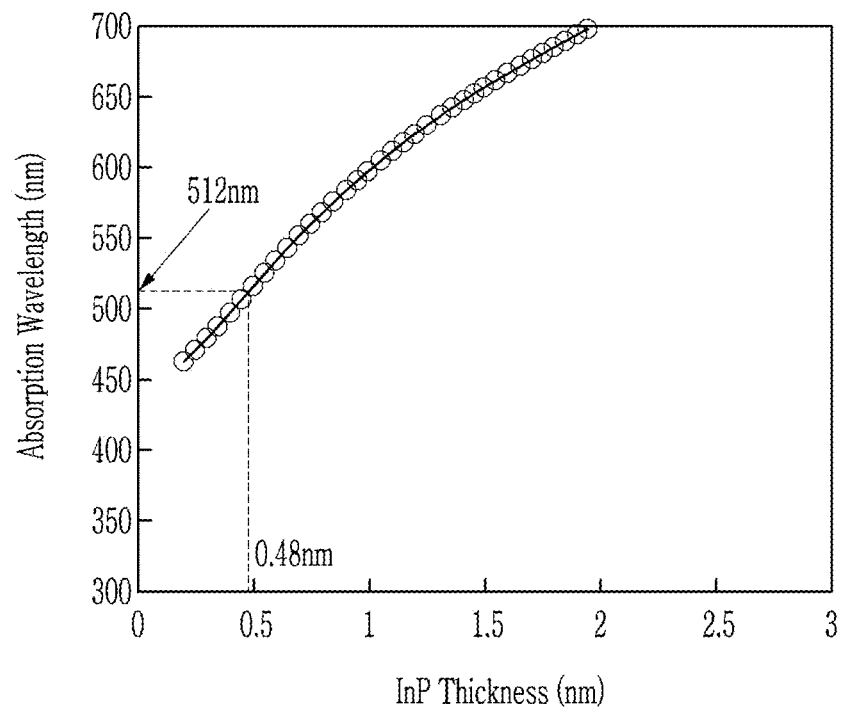
FIG. 6 is a graph of Absorption Wavelength (nm) versus InP Thickness (nm) showing a change of ultraviolet-visible (UV-Vis) absorption wavelength with respect to a thickness of the emission layer (e.g., an InP emission layer) of a nanoplatelet (e.g., having a ZnSe and/or ZnS shell of a predetermined thickness of) according to an embodiment. In order to realize a visible light, the thickness of the InP layer may be less than or equal to about 2 nm. For a green light (about 500 nm to 560 nm, a thickness of the InP may be from about 0.4 nm (e.g., 0.48 nm) and to about 0.8 nm.

In a nanoplatelet having an indium phosphide layer, a zinc selenide layer, and a zinc sulfide layer, an absorption wavelength depending upon change of a thickness of the zinc selenide layer and the indium phosphide layer is calculated through a computer simulation using an effective mass approximation (EMA). FIG. 6 is a graph showing an absorption wavelength of nanoplatelet depending upon a thickness of an indium phosphide layer.

From the results, it is confirmed that an emission wavelength may not be affected when the thickness of the zinc selenide layer is greater than 0.5 nanometers (nm).

The results of FIG. 6 suggest that the final nanoplatelet may emit visible light when the thickness of the indium phosphide layer is less than or equal to about 2 nm, and that the final nanoplatelet may emit green light when the thickness of the indium phosphide layer is greater than or equal to about 0.4 nm and less than or equal to 0.8 nm.

Example 2

Figure 7:
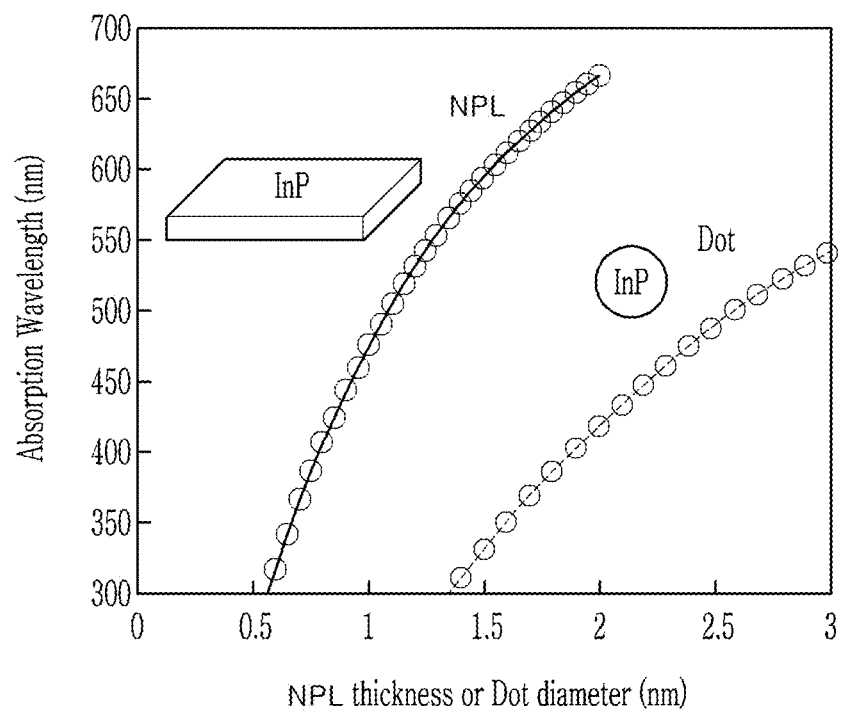
FIG. 7 is a graph of Absorption Wavelength (nm) versus nanoplatelet (NP) thickness or (quantum) Dot diameter (nm) showing a change of UV-Vis absorption wavelength with respect to a thickness of the InP layer of the nanoplatelet including indium and phosphorus and a change of UV-Vis absorption wavelength with respect to a diameter of an InP core including indium and phosphorus.

For the indium phosphide nanoplatelet and the indium phosphide spherical core, an absorption wavelength depending upon a layer thickness or a core diameter is calculated through a computer simulation using EMA, and the results are shown in FIG. 7.

The results of FIG. 7 suggest that the final nanoplatelet may absorb light of from about 300 nm to about 700 nm, when the thickness of the indium phosphide layer is greater than or equal to 0.5 nm and less than or equal to about 2 nm, emitting visible light.

Example 3: ZnSe Template Synthesis

A Se/TOP stock solution is obtained by dispersing selenium in trioctylphosphine (TOP).

Zinc acetate and oleic acid are added into a 50 milliliter (mL) reaction flask including oleylamine and heated at 120° C. under the vacuum. After passing approximate 1 hour, the atmosphere in the reactor is substituted with an inert gas (nitrogen). While increasing the reactor temperature up to 170° C., oleylamine and Se/TOP stock solutions are injected thereto. After completing the injection, a reaction is performed for greater than or equal to 70 minutes.

After completing the reaction, acetone is added to the reaction solution which is rapidly cooled to a room temperature and centrifuged to provide a precipitate, and the precipitate is dispersed in toluene to provide a ZnSe template.

A content ratio (i.e., a mole ratio, hereinafter, the wording "a content ratio" refers to a mole ratio) of the used Zn precursor and the Se precursor is adjusted to around 1:3.

Figure 8:
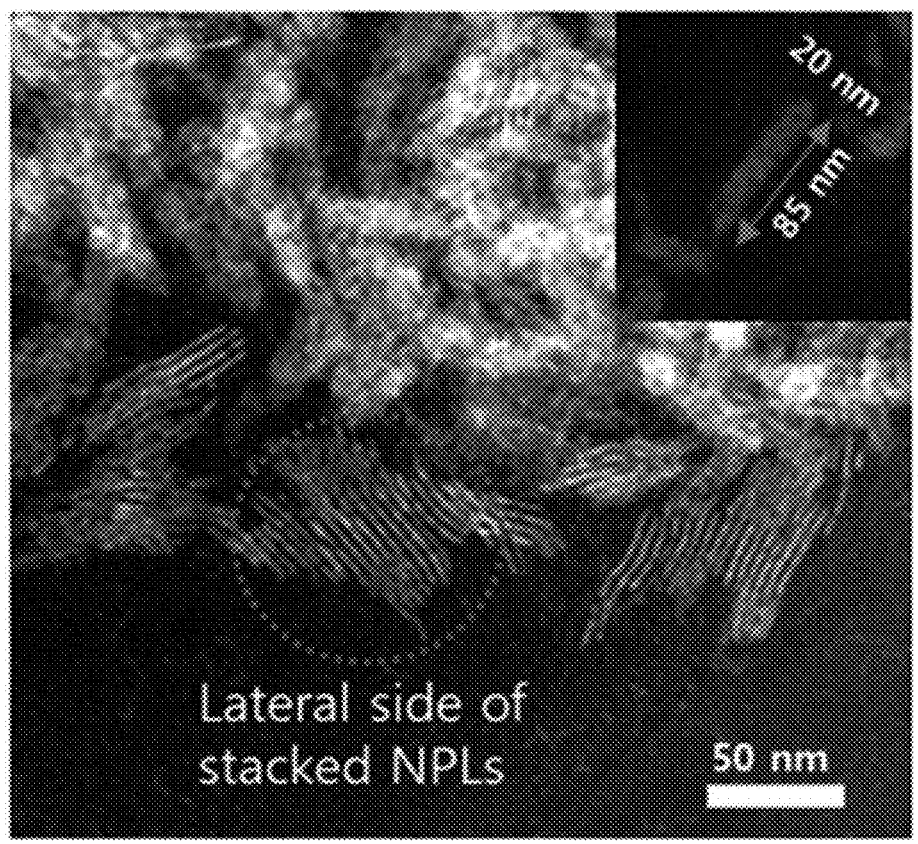
FIG. 8 shows a transmission electron microscope photograph of the two-dimensional template produced in Example 3.

A transmission electron microscopy analysis is performed for a template, and the results are shown in FIG. 8. From FIG. 8, it is confirmed that a lateral size of the template has a length of 85 nm and a width of 20 nm (a lateral dimension of about 85 nm×about 20 nm=1700 nm$^2$), and the template thickness is about 1.5 nm.

Figure 9:
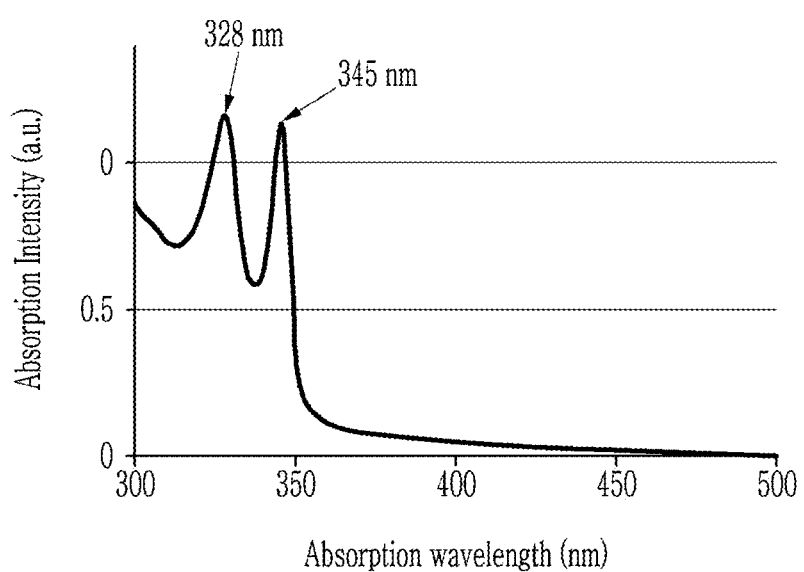
FIG. 9 is a graph of Absorption Intensity (arbitrary units (a.u.)) versus Absorption wavelength (nm) showing a UV-Vis absorption spectrum of the two-dimensional template produced in Example 3.

UV-Vis absorption spectroscopy analysis is performed for the template, and the results are shown in FIG. 9. From FIG. 9, it is confirmed that the template has two UV-Vis absorption peaks.

Example 4

Indium acetate is added together with an organic ligand of palmitic acid into a 300 mL reaction flask including oleylamine and heated under vacuum at 120° C. The atmosphere in the flask is substituted with nitrogen ($N_2$). A toluene dispersion of the obtained ZnSe template is rapidly added into the reaction flask and subsequently injected with a TOP dispersion of tris(trimethylsilyl)phosphine (hereinafter, also referred to as 'TMSP').

After completing the injection, the reaction is performed for 30 minutes at 120° C.

The content ratio of the used indium precursor and phosphorus precursor is adjusted to around 1:8. A content ratio (Zn:In) of the used zinc precursor in the template to the used indium precursor is adjusted to around 3:1.

After completing the reaction, ethanol is added into the reaction solution which is rapidly cooled to a room temperature and centrifuged to obtain a precipitate, and the precipitate is dispersed into toluene to obtain a nanoplatelet. An average lateral size of the obtained nanoplatelet is similar to that of the template, and the total thickness is about 1.7 nm.

Figure 10:
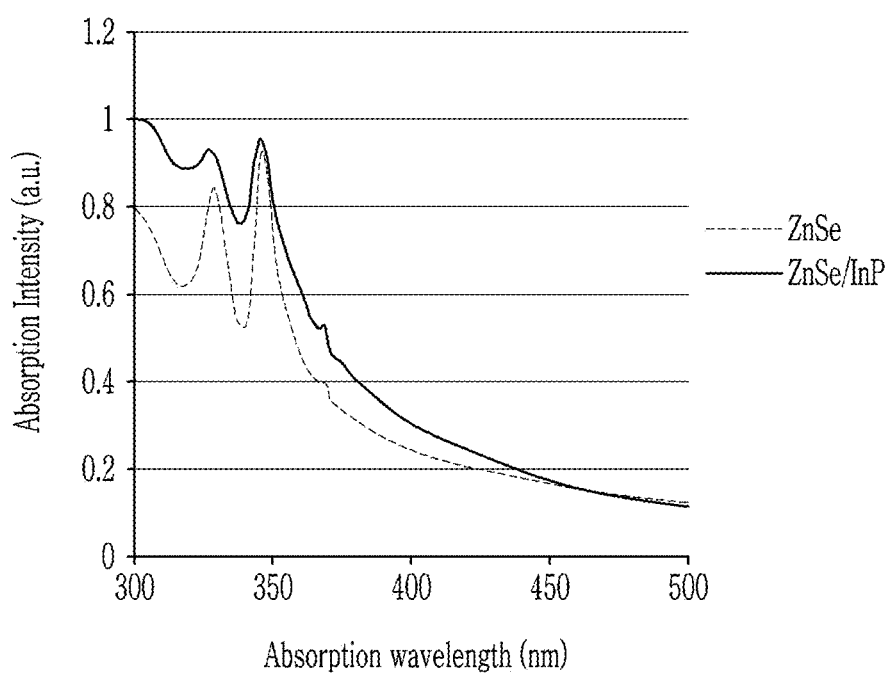
FIG. 10 is a graph of Absorption Intensity (arbitrary units (a.u.)) versus Absorption wavelength (nm) showing UV-Vis absorption spectra of the two-dimensional template and nanoplatelet produced in Example 4.

UV-Vis absorption spectroscopy analysis is performed for the template and the nanoplatelet, and the results are shown in FIG. 10. From FIG. 10, it is confirmed that the obtained nanoplatelet has two absorption peaks, and a difference between a first absorption peak of the template and a first absorption peak of the nanoplatelet is less than 100 nm.

Nanoplatelet is subjected to ICP-AES analysis, and the results are shown in Table 1.

Example 5

A nanoplatelet is obtained in accordance with the same procedure as in Example 4, except that zinc oleate is further added as the zinc precursor together with the organic ligand into the reaction flask.

A content ratio of the used indium precursor, zinc precursor, phosphorus precursor is each adjusted to around 1:1:8. A content ratio (Zn:In) of the used zinc precursor in the template to the used indium precursor is adjusted about 1:1.

After completing the reaction, ethanol is added into the reaction solution which is rapidly cooled to a room temperature and centrifuged to obtain a precipitate, and the precipitate is dispersed in toluene to obtain a nanoplatelet. An average lateral size of the obtained nanoplatelet is similar to that of the template, and the thickness is about 2 nm. The template and the nanoplatelet are performed with UV-Vis absorption spectroscopy. Resultantly, it is confirmed that the obtained nanoplatelet has two absorption peaks, and a difference between a first absorption peak of the template and a first absorption peak of the nanoplatelet is less than 100 nm.

A nanoplatelet is subjected to ICP-AES analysis, and the results are shown in Table 1.

TABLE 1

| Example Nos. and Compositions | Mole ratio | | | |
| --- | --- | --- | --- | --- |
| | P:Se | Zn:Se | Se:Se | In:Se |
| Example 5 ZnSe/InZnP | 1.51:1 | 5.91:1 | 1.00:1 | 0.83:1 |
| Example 4 ZnSe/InP | 0.13:1 | 1.54:1 | 1.00:1 | 0.15:1 |

The bulk energy bandgap of indium phosphide is about 1.3 eV and the bulk energy bandgap of zinc selenide is about 2.82 eV.

A TEM-EDX analysis indicates that at a lateral surface of the NPL, the components of the first shell (e.g., indium and phosphorous) are present and at a thickness surface of the NPL, all the components of the first shell and the template (i.e., indium, phosphorous, zinc, and selenium) are present.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A nanoplatelet comprising
a two-dimensional template comprising a first semiconductor nanocrystal; and
a first shell comprising a second semiconductor nanocrystal disposed on a surface of the two-dimensional template, the second semiconductor nanocrystal having a composition different from the first semiconductor nanocrystal,
wherein the second semiconductor nanocrystal comprises a Group III-V compound,
wherein the nanoplatelet does not comprise cadmium,
wherein the first semiconductor nanocrystal comprises a Group II-VI compound,
wherein the Group III-V compound comprises:
a Group III metal selected from gallium, indium, or a combination thereof; and phosphorus, and
wherein an energy bandgap of the second semiconductor nanocrystal is less than an energy bandgap of the first semiconductor nanocrystal.

2. The nanoplatelet of claim 1, wherein the first semiconductor nanocrystal comprises ZnA, wherein A is selenium, tellurium, sulfur, oxygen, or a combination thereof.

3. The nanoplatelet of claim 2, wherein the first semiconductor nanocrystal comprises ZnSe, ZnS, ZnTe, ZnTeSe, ZnSeS, ZnTeS, ZnTeSeS, ZnO, or a combination thereof.

4. The nanoplatelet of claim 1, wherein the first shell is disposed on opposite surfaces of the two-dimensional template.

5. The nanoplatelet of claim 1, wherein the first shell is disposed directly on the two-dimensional template.

6. The nanoplatelet of claim 1, wherein the Group III-V compound further comprises a Group II metal.

7. The nanoplatelet of claim 1, wherein the Group III-V compound comprises InP, InGaP, GaP, InZnP, GaZnP, InGaZnP, or a combination thereof.

8. The nanoplatelet of claim 1, wherein the nanoplatelet has a lateral dimension of greater than about 400 square nanometers.

9. The nanoplatelet of claim 1, wherein the nanoplatelet has a lateral dimension of greater than or equal to about 1,000 square nanometers.

10. The nanoplatelet of claim 1, wherein the nanoplatelet has a lateral dimension of less than or equal to about 10,000 square nanometers.

11. The nanoplatelet of claim 1, wherein a lateral surface of the nanoplatelet has an aspect ratio of greater than or equal to about 1:1.1 and less than or equal to about 1:8.

12. The nanoplatelet of claim 1, wherein a thickness of the first shell of the nanoplatelet is greater than or equal to about 0.1 nanometers and less than or equal to about 2 nanometers.

13. The nanoplatelet of claim 1, wherein the nanoplatelet further comprises a second shell comprising a third semiconductor nanocrystal that is disposed on the first shell, wherein the third semiconductor nanocrystal has a composition different from a composition of the second semiconductor nanocrystal.

14. The nanoplatelet of claim 13, wherein the third semiconductor nanocrystal comprises a Group II-VI compound.

15. The nanoplatelet of claim 13, wherein the third semiconductor nanocrystal comprises ZnA, wherein A is selenium, tellurium, sulfur, oxygen, or a combination thereof.

16. The nanoplatelet of claim 13, wherein an energy bandgap of the third semiconductor nanocrystal is larger than an energy bandgap of the second semiconductor nanocrystal.

17. The nanoplatelet of claim 1, wherein a transmission electron microscope energy disperse X-ray spectroscopy analysis of a lateral surface of the nanoplatelet exhibits elements present in an outermost layer.

18. The nanoplatelet of claim 1, wherein the nanoplatelet exhibits two or more absorption peaks in a range of less than or equal to about 500 nanometers.

19. The nanoplatelet of claim 1, wherein a difference between a first absorption peak of the two-dimensional template and a first absorption peak of the nanoplatelet is less than about 100 nanometers.

20. The nanoplatelet of claim 1, wherein
the first semiconductor nanocrystal comprises a zinc chalcogenide, and
the second semiconductor nanocrystal comprises indium and phosphorus, and
wherein in the nanoplatelet, an amount of indium based on 1 mole of the chalcogen element is from about 0.05 moles to about 2 moles, an amount of zinc based on 1 mole of the chalcogen element is greater than or equal to about 1 mole and less than or equal to about 10 moles, and an amount of phosphorus based on 1 mole of the chalcogen element is from about 0.05 to about 5 moles.

21. The nanoplatelet of claim 1, wherein a transmission electron microscope energy disperse X-ray spectroscopy analysis of a surface extending in a thickness direction of the nanoplatelet exhibits elements present in the first semiconductor nanocrystal and elements present in the second semiconductor nanocrystal.

22. A method of producing the nanoplatelet of claim 1, comprising
reacting a first metal precursor of the first semiconductor nanocrystal and a first non-metal precursor of the first semiconductor nanocrystal in an organic solvent in the presence of an organic ligand at a temperature of less than about 175° C. to synthesize a two-dimensional template; and
reacting a second metal precursor of the second semiconductor nanocrystal and a second non-metal precursor of the second semiconductor nanocrystal in an organic solvent in the presence of an organic ligand and the two-dimensional template at a temperature of less than or equal to about 200° C. to form a first shell comprising the second semiconductor nanocrystal on a surface of the two-dimensional template and produce the nanoplatelet.

23. A semiconductor nanocrystal polymer composite comprising
a polymer matrix; and
a plurality of semiconductor nanocrystal particles dispersed in the polymer matrix,
wherein the plurality of semiconductor nanocrystal particles comprises the nanoplatelet of claim 1.

24. An electronic device comprising the nanoplatelet of claim 1.

* * * * *